(12) United States Patent
Seko et al.

(10) Patent No.: US 10,263,116 B2
(45) Date of Patent: Apr. 16, 2019

(54) THIN FILM TRANSISTOR AND DISPLAY DEVICE

(71) Applicant: NLT Technologies, Ltd., Kanagawa (JP)

(72) Inventors: Nobuya Seko, Kanagawa (JP); Yoshikazu Hatazawa, Kanagawa (JP); Hiroyuki Sekine, Kanagawa (JP)

(73) Assignee: NLT TECHNOLOGIES, LTD., Kanagawa (JP)

( * ) Notice: Subject to any disclaimer, the term of this patent is extended or adjusted under 35 U.S.C. 154(b) by 0 days.

(21) Appl. No.: 14/695,133

(22) Filed: Apr. 24, 2015

(65) Prior Publication Data

US 2015/0311351 A1 Oct. 29, 2015

(30) Foreign Application Priority Data

Apr. 24, 2014 (JP) .................................. 2014-090724

(51) Int. Cl.
*H01L 29/40* (2006.01)
*H01L 29/786* (2006.01)

(52) U.S. Cl.
CPC .. *H01L 29/78621* (2013.01); *H01L 29/78633* (2013.01); *H01L 29/78645* (2013.01); *H01L 29/78696* (2013.01)

(58) Field of Classification Search
CPC .............................................. H01L 29/78621
See application file for complete search history.

(56) References Cited

U.S. PATENT DOCUMENTS 5,414,547 A * 5/1995 Matsuo ............. G02F 1/136209
349/44
5,714,547 A 2/1998 Li et al.
(Continued)

FOREIGN PATENT DOCUMENTS

CN 101009333 8/2007
CN 101228637 7/2008
(Continued)

OTHER PUBLICATIONS

Japanese Office Action dated Jan. 23, 2018 in corresponding Japanese Patent Application No. 2014-090724 with JPO machine translation of Japanese Office Action.
Chinese Office Action for Application No. 201510202482.3, dated Jul. 18, 2018, with English translation provided.

*Primary Examiner* — Nishath Yasmeen
(74) *Attorney, Agent, or Firm* — Young & Thompson

(57) ABSTRACT

For improved high-definition of liquid crystal display devices and the use thereof in bright places, luminance of backlights is being increased. Thus, when a light-shielding layer is employed for suppressing a light leakage current, characteristic fluctuations of transistors are caused, which may result in showing faulty display. In a dual-gate thin film transistor having a floating light-shielding layer, the layout is designed in such a manner that the film thickness of the insulating layer is equal to or more than 200 nm and equal to or less than 500 nm and that Sg/Sd becomes 4.7 or more, provided that an opposing area between the light-shielding layer and a drain region in a place at the outermost side of the active layer is Sd and the opposing area between the light-shielding layer and the gate electrode is Sg.

1 Claim, 30 Drawing Sheets

(56) References Cited

U.S. PATENT DOCUMENTS

| | | | |
|---|---|---|---|
| 6,043,859 A * | 3/2000 | Maeda | G02F 1/13458 |
| | | | 257/761 |
| 6,590,229 B1 * | 7/2003 | Yamazaki | G02F 1/136213 |
| | | | 257/71 |
| 6,680,488 B2 * | 1/2004 | Shibata | G02F 1/136209 |
| | | | 257/59 |
| 7,629,650 B2 | 12/2009 | Onogi et al. | |
| 2004/0065882 A1 | 4/2004 | Yamazaki et al. | |
| 2007/0159565 A1 * | 7/2007 | Segawa | G02F 1/136209 |
| | | | 349/38 |
| 2008/0073647 A1 * | 3/2008 | Arasawa | H01L 27/1266 |
| | | | 257/66 |
| 2008/0217618 A1 * | 9/2008 | Deane | H01L 27/12 |
| | | | 257/59 |
| 2012/0107985 A1 * | 5/2012 | Yamazaki | H01L 29/66757 |
| | | | 438/34 |

FOREIGN PATENT DOCUMENTS

| | | |
|---|---|---|
| JP | 08-211406 | 8/1996 |
| JP | 09-051099 | 2/1997 |
| JP | 10-070277 | 3/1998 |
| JP | 11-084422 | 3/1999 |
| JP | 2000-276076 | 10/2000 |
| JP | 2001-33822 | 2/2001 |
| JP | 2001-066587 | 3/2001 |
| JP | 2001-66636 | 3/2001 |
| JP | 2007-201073 | 8/2007 |
| JP | 2009-503572 | 1/2009 |
| WO | 2011027650 | 3/2011 |
| WO | WO 2011024911 | 3/2011 |

* cited by examiner

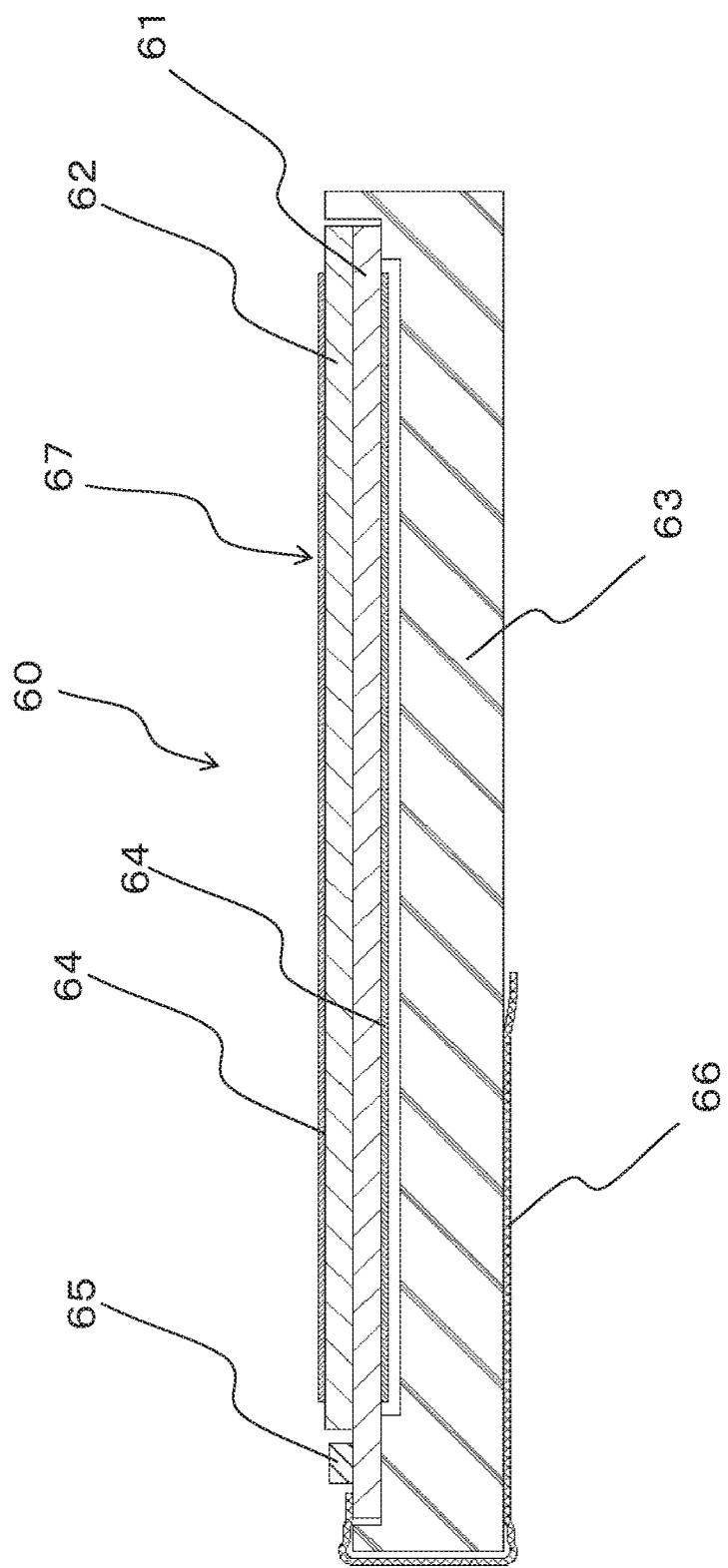

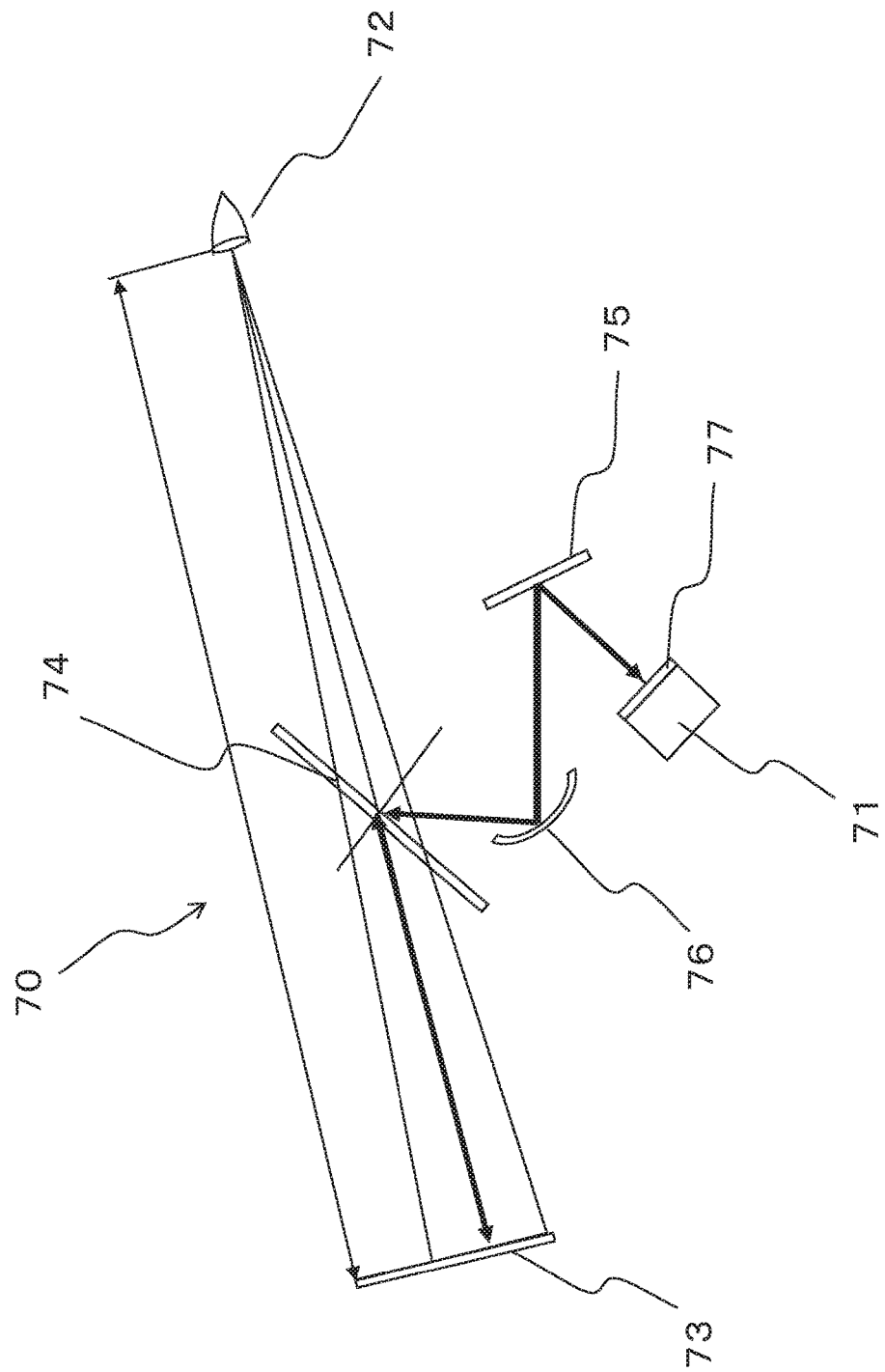

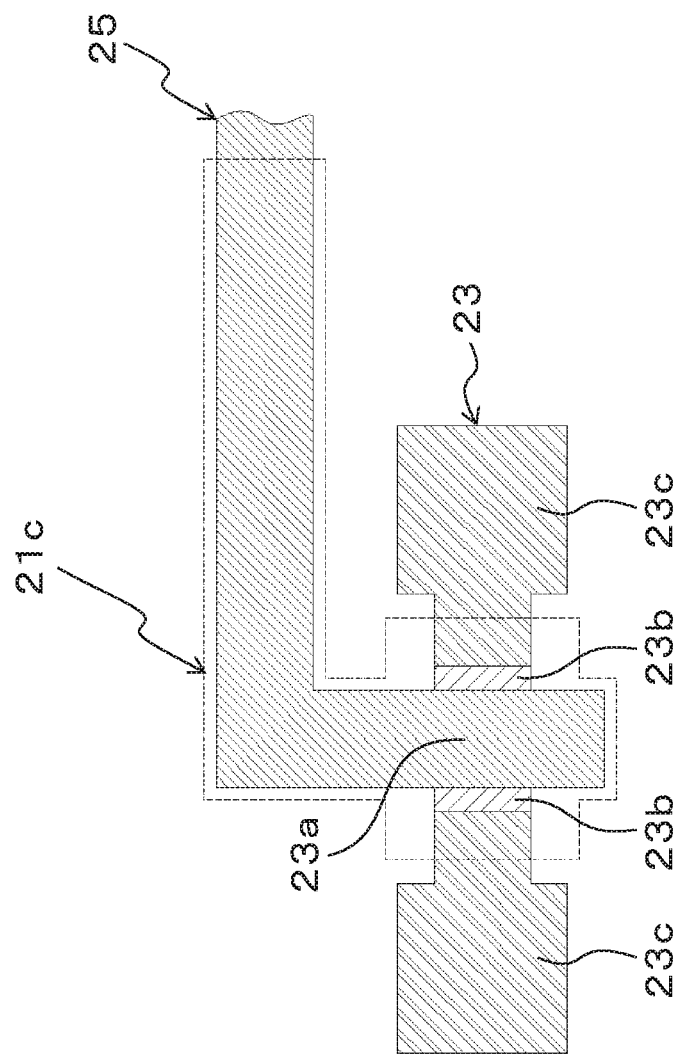

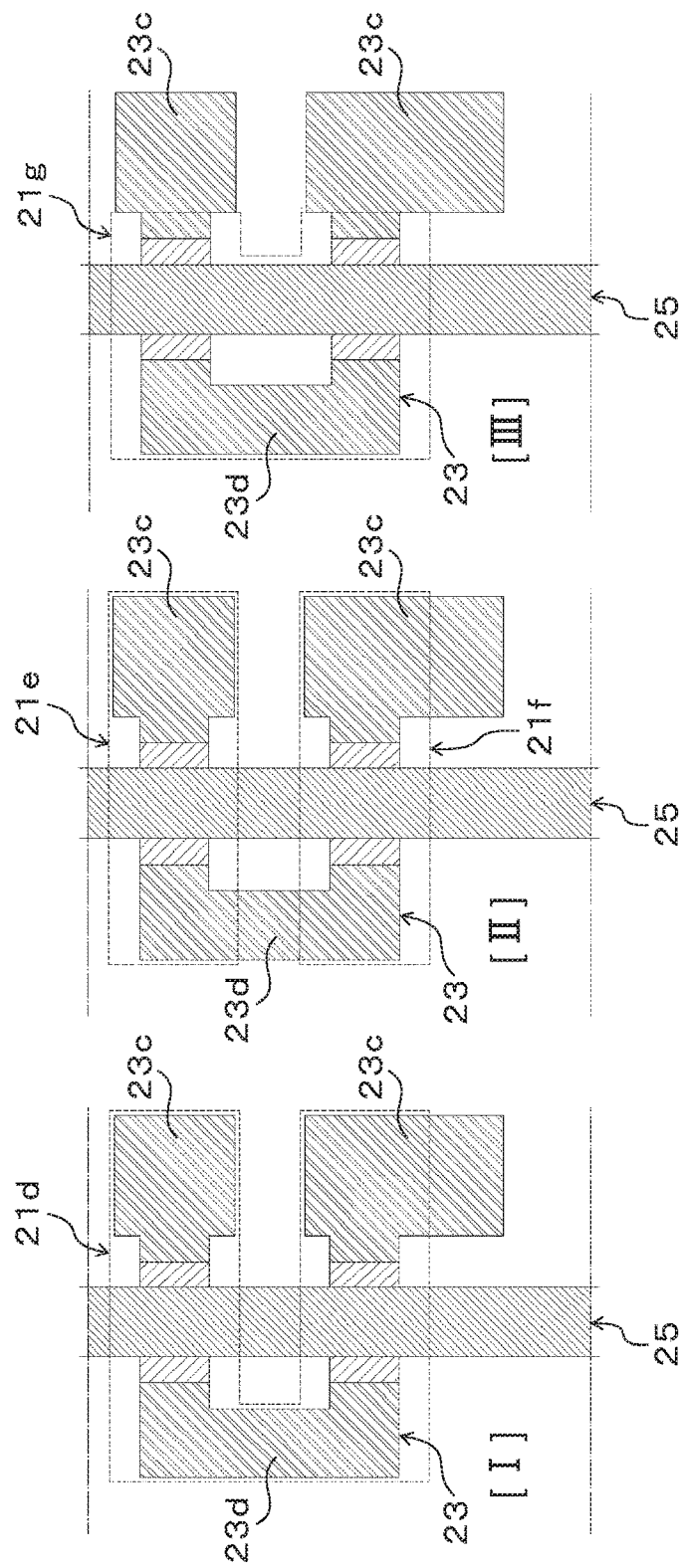

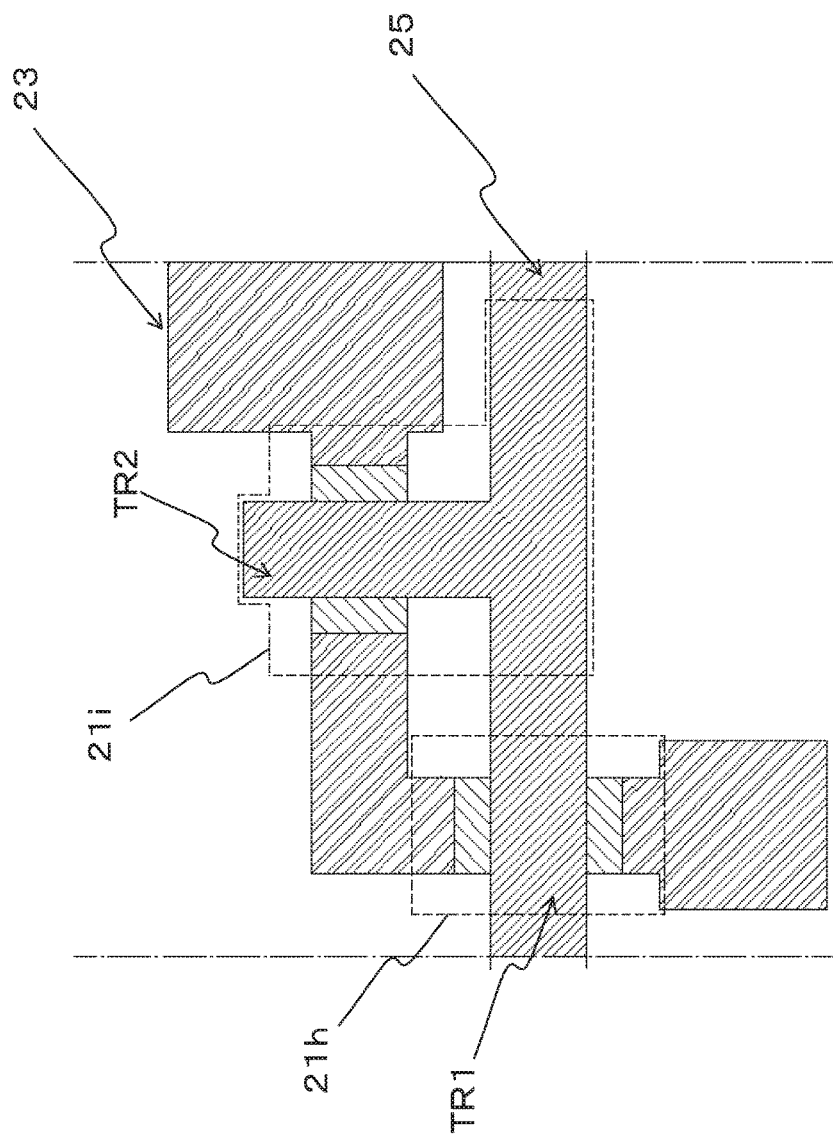

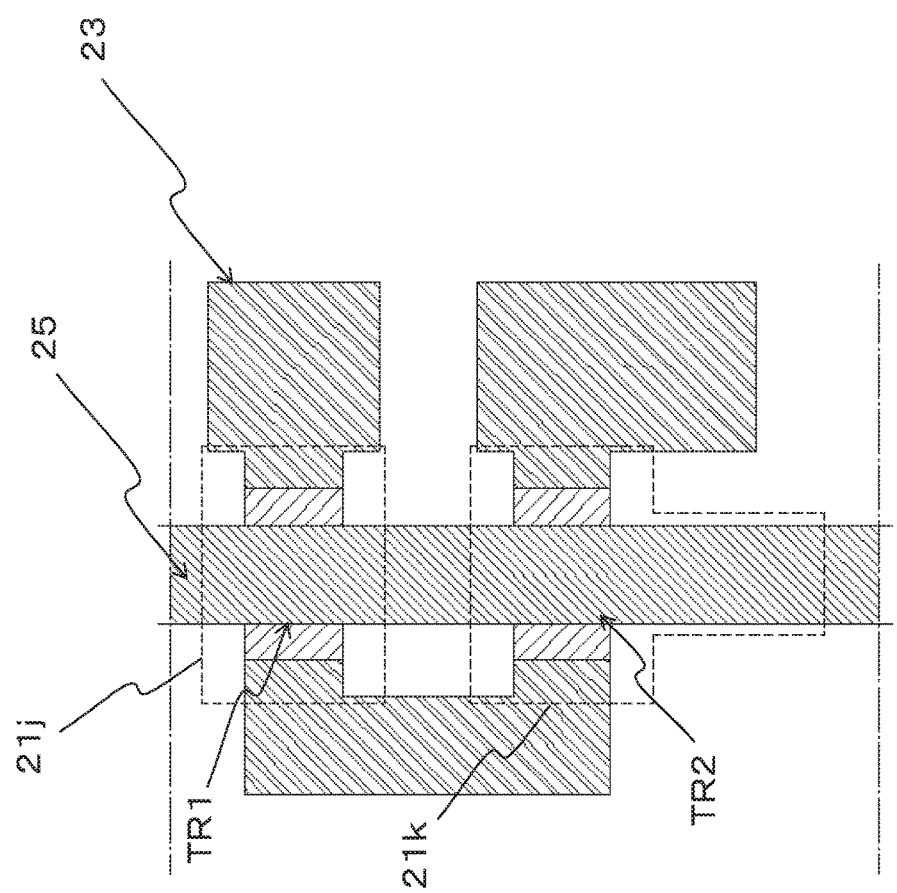

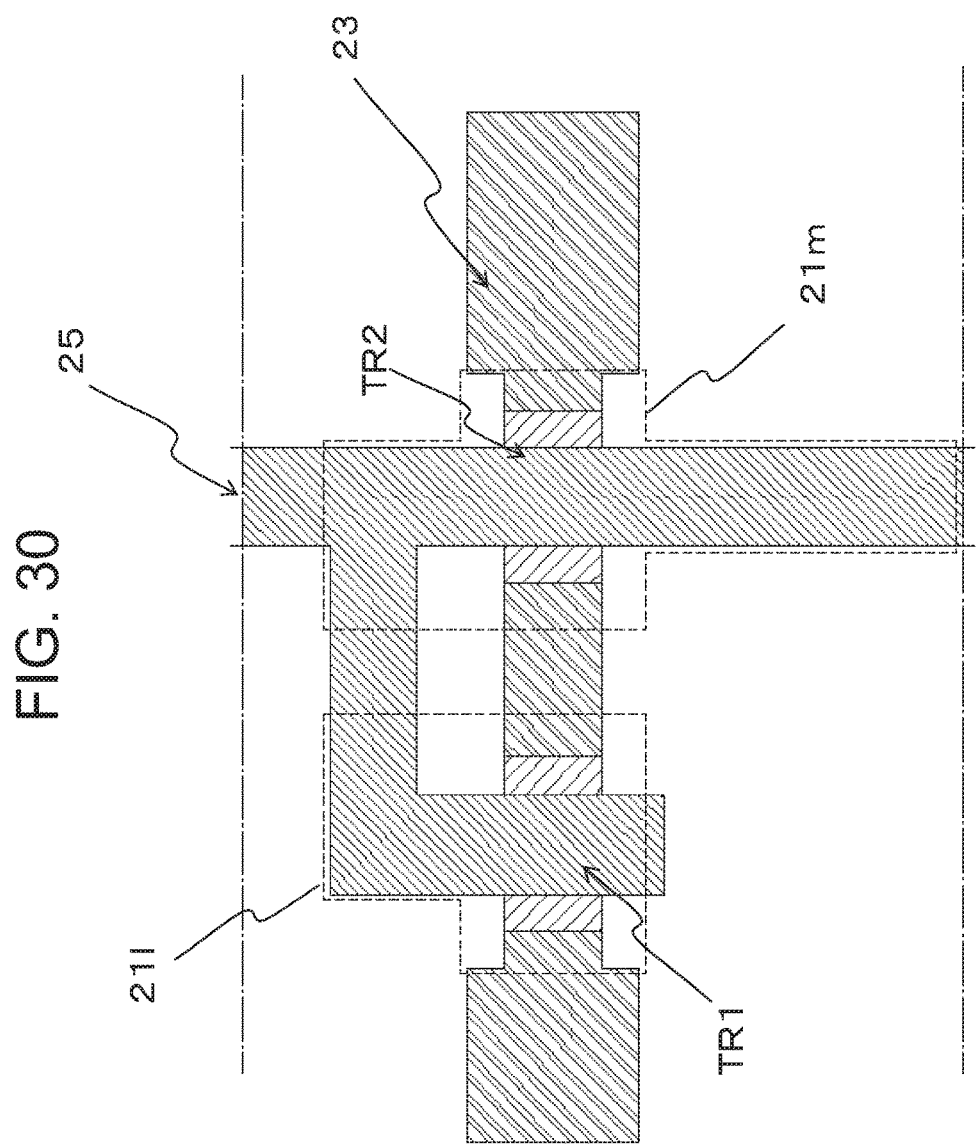

THIN FILM TRANSISTOR AND DISPLAY DEVICE

CROSS-REFERENCE TO RELATED APPLICATION

This application is based upon and claims the benefit of priority from Japanese patent application No. 2014-090724, filed on Apr. 24, 2014, the disclosure of which is incorporated herein in its entirety by reference.

BACKGROUND OF THE INVENTION

1. Field of the Invention

The present invention relates to a thin film transistor and a display device which includes the thin film transistor. More specifically, the present invention relates to an active matrix type liquid crystal display device which is a display device that uses a high-luminance light source.

2. Description of the Related Art

Recently, regarding flat panel displays such as liquid crystal displays (LCD), there are more proposals for various forms of apparatuses represented by keywords such as wearable and ubiquitous, more diversifications of use environments, and the like. Accordingly, demands for small and high-definition displays to be loaded in mobile smartphones and tablet terminals are being increased rapidly. In order to achieve small and high-definition LCD, it is essential to form fine patterns. However, the resolution limit in a process of manufacturing such as the minimum line width and the like cannot simply be overcome even when the pixel size is reduced. Therefore, in order to recover the deterioration in the brightness caused by decrease in the aperture ratio, the luminance of the backlight is also increased.

Further, other than the direct-view type displays described above, it is also proposed to be applied to head-up displays (HUD), for example. This is the use in which display contents shown via a magnifying optical system are reflected by window glass (front window) or a transparent screen to view the display information along with the actual scenery outside the window and it has been put to practical use in airplanes, vehicles, and the like. In such use, extremely intense light (e.g., 1,000,000 cd/m² or more) compared to that of the direct-view type display is irradiated to a small display panel because of the brightness of the use environment, the light loss caused before it is visually recognized, and the like.

As described, the use of high-luminance light source is becoming expanded particularly in liquid crystal displays.

In the meantime, as a pixel-driving device of the small high-definition LCD, a low-temperature polycrystalline silicon (Poly-Si) TFT (Thin Film Transistor) that uses a polycrystalline silicon for a transistor active layer is used in many cases. The polycrystalline silicon TFT has a higher driving capacity compared to an amorphous silicon (a-Si) TFT, so the size of the element thereof can be reduced. Thus, the aperture ratio can be increased when used for a pixel. Further, a part of a driver circuit can be formed therewith. Therefore, the driver IC chip can be omitted, so that it is possible to decrease the size and to improve the reliability of the connection part.

The polycrystalline silicon TFT often employs an LDD (Lightly Doped Drain) structure in which impurity is lightly doped in an offset part between the channel region and the source-drain region to suppress a leakage current under an off state. However, the polycrystalline silicon TFT when used with the high-luminance backlight directly receives irradiation of 1,000,000 cd/m² level, for example, so that leakage current under an off state is increased due to carriers generated by photoexcitation. Therefore, the influences of the light from the backlight to the polycrystalline silicon TFT cause display failures, operation malfunctions, and the like, e.g., deterioration in the contrast and increase in crosstalk, flicker, and the like. Thus, it is desired to suppress those.

Next, related techniques depicted in Patent Documents will be described.

In order to suppress such issues caused by the leakage current, Japanese Unexamined Patent Publication Hei 9-51099 (Abstract and the like) (Patent Document 1) suggests a technique in which a light-shielding layer is provided in a polycrystalline silicon active layer including a channel region, an LDD region, and a source-drain region via an insulating layer. With this technique, the conductive light-shielding layer works as a bottom gate electrode from the back surface (surface on the opposite side from the normal gate electrode) of the polycrystalline silicon active layer, thereby changing the transistor characteristic.

Japanese Unexamined Patent Publication 2001-66587 (Paragraph 0016 and the like) (Patent Document 2) suggests a structure in which a light-shielding layer is connected to an external power source to fix the potential of the light-shielding layer in order to suppress such change in the characteristic. However, the biggest issue of this technique is that the number of steps in the manufacture process is increased so that the cost is increased without questions.

As a technique for suppressing the off-leakage current while the light-shielding layer is being maintained in an electrically floating state, there is a following proposal that utilizes capacitance coupling.

WO 2011/027650 (Paragraphs 0020, 0021 and the like) (Patent Document 3) suggests a technique that, in a case of a light-shielding layer is adopted on a coplanar-type LDD transistor, the terminal voltages of the transistor and the capacitance between the light-shielding layer and the gate electrode are set so that the potential of the light-shielding layer becomes minus (or plus) at an off state.

In this technique, design indicators are acquired from the result of calculations based on an equivalent circuit. When judging the characteristics, only the leakage current at the off state is used, and both the terminal voltages of the transistor and the capacitance between the light-shielding layer and the gate electrode are settable parameters. Thus, this technique does not regulate a specific range regarding the geometrical shape of the transistor and the layout of the electrodes.

Japanese Unexamined Patent Publication Hei 8-211406 (Abstract and the like) (Patent Document 4) is an example of a case for regulating the geometrical shape of the transistor. In this example, the transistor is a top-gate type and has gate offset. In addition, its light-shielding layer has larger area than a polycrystalline silicon active layer. Patent Document 4 suggests a technique that suppresses the off-leakage current by the mutual relations regarding the static capacitances between the protruded area of light-shielding layer from the active layer and other conductive layers (each of the gate wiring, the data wiring, and the pixel electrode). The static capacitance between the electrodes is mostly determined according to the opposing area, so that it is considered a geometrical regulation.

With this technique, provided that the capacitance between the light-shielding layer and the gate wiring is Cg and the capacitance between the light-shielding layer and the data wiring or the pixel electrode is Cd, it is considered preferable to satisfy a following relation.

$$0.6 \times Cg \leq Cd \leq 5 \times Cg$$

This expression can be transformed into a following relation.

$$0.2 \leq Cg/Cd \leq 1.66$$

However, according to views and knowledge of the inventors et al., with the range shown in this expression, the fluctuation of the transistor characteristic when the drain voltage changes cannot fall within a preferable range.

As another example of a case for regulating the geometrical shape of the transistor, Japanese Unexamined Patent Publication Hei 10-70277 (Abstract and the like) (Patent Document 5) discloses a technique which, in a normal staggered type or inverted staggered type amorphous silicon thin film transistor, sets the capacitance between the light-shielding layer and the gate electrode to be three times or more than the capacitance between the light-shielding layer and the drain electrode. In this technique, it is mentioned that not only the capacitance but also the opposing area is also set to be three times or more.

The basis for setting those to be three times or more is so described that the potential of the light-shielding layer does not exceed the threshold voltage of the transistor. However, while the leakage current in the gate voltage to be off is extremely small, the current flown between the source and drain in a sub-threshold region having voltage of equal to or less than the threshold voltage is a current that is extremely large. Further, the fluctuation in the transistor characteristic caused due to the change in the drain voltage cannot be suppressed sufficiently by setting those about only three times.

The common point in Patent Documents 3, 4, and 5 mentioned above is that the capacitance of the light-shielding layer—the drain region and the capacitance of the light-shielding layer—the gate electrode are regulated in such a manner that the potential of the light-shielding layer satisfies a specific condition.

The first issue is that the transistor characteristic changes when a light-shielding layer is provided between a glass substrate and an active layer in a thin film transistor. The reason thereof is as follows.

In order to suppress the light leakage current caused by irradiation of high-intensity light, a light-shielding layer is provided so that the light is not directly irradiated to the thin film transistor. Assuming a case of a coplanar-type thin film transistor having a polycrystalline silicon active layer, the light-shielding layer is placed between the glass substrate and the polycrystalline silicon active layer and an underlying insulating layer is placed between the light-shielding layer and the active layer. The light-shielding layer is located on the lowermost layer, so that it goes through all the transistor manufacture processes executed thereafter. Thus, the light-shielding layer is required to be resistant for those processes. Naturally, the light-shielding layer is required to have the characteristic to shield the light. As the materials that can be used for the light-shielding layer, high melting point metals of such as chromium (Cr) and molybdenum (Mo) are the candidates.

However, the metal material to be the light-shielding layer is conductive, and it is placed in the vicinity of the polycrystalline silicon active layer and overlapped with the drain region for securely covering the channel region and the LDD region. Thus, the light-shielding layer comes to have a potential by the influence of the drain voltage, and the potential works on the active layer like the gate electrode, thereby changing the behavior for the original gate electrode potential. Particularly when the thin film transistor is used for the pixel of the active-matrix LCD, the potentials of the source and the drain of the transistor change every moment so that reversal of the source and drain in terms of the potentials may occur frequently. That is, depending on the drain voltage that changes greatly according to the operation state, the transistor characteristic is changed.

The change in the transistor characteristic influences the design margin. When designing a device such as a display device, a factor of fluctuation that may occur in the manufacture process, a factor of characteristic change that may occur in a long-term use process, and a narrow sense of operation margin are added to the minimum voltage required for driving to set the drive voltage. When the fluctuation in the transistor characteristic that depends on the drain voltage exceeds the operation margin, operation malfunctions are caused. In the meantime, when it is designed just to expand the operation margin, the performance of the device is to be sacrificed.

In Patent Documents 3, 4, and 5, regarding the current when the thin film transistor is off, the capacitance of the light-shielding layer—the drain region and the capacitance of the light-shielding layer—the gate electrode are regulated in such a manner that the potential of the light-shielding layer satisfies a specific condition. However, while the potential of the light-shielding layer is estimated, the point that the potential of the light-shielding layer works on the channel region of the active layer and the LDD region and influences the transistor characteristic is not sufficiently taken into consideration. For example, even when the light-shielding layers have a same potential, the influence upon the active layer, i.e., the extent in the changes in the characteristics, ought to vary when the film thickness of the underlying insulating layers are different. However, there is nothing mentioned about this points in each of Patent Documents.

The second issue is that the cost may be increased. Even though the potential of the light-shielding layer can be controlled by forming a structure which supplies some kind of potential to the light-shielding layer, the number of steps is increased so that the cost is increased without a question.

It is therefore an exemplary object of the present invention to exclude the above-described issues without adding any new steps and processes and employing a design to expand the operation margin other than providing a light-shielding layer via an underlying insulating layer, so as to achieve a thin film transistor which can suppress a light leakage current and characteristic fluctuation that may occur depending on the drain voltage even when a high-luminance backlight is used and, further, to achieve a display device such as a liquid crystal display using such thin film transistor.

SUMMARY OF THE INVENTION

The thin film transistor according to an exemplary aspect of the invention is characterized as a thin film transistor which includes: a channel region, an LDD region, and a drain region formed with a polycrystalline silicon active layer; a gate electrode provided at least in the channel region via a gate insulating film; and an electrically floating light-shielding layer which overlaps at least with the channel region and the LDD region via an insulating layer, wherein: the thin film transistor is of a dual-gate structure; film thickness of the insulating layer is 200 nm or more and 500 nm or less; and Sg/Sd is 4.7 or more, provided that an area where the light-shielding layer overlaps with the drain region is Sd and an area where the light-shielding layer overlaps with the gate electrode is Sg.

BRIEF DESCRIPTION OF THE DRAWINGS

FIG. 3 is a sectional view showing an example of a display device;

FIG. 4 is a conceptual diagram showing a head-up display as an example of the display device;

FIG. 23 is a plan view showing a design example (single gate) of a light-shielding layer according to the second exemplary embodiment;

FIG. 25A is a plan view showing a layout example of a dual gate transistor in which a common light-shielding layer is provided, FIG. 25B is a plan view showing a layout example of a dual gate transistor according to a third exemplary embodiment in which the light-shielding layer is divided into separate light-shielding layers; and FIG. 25C is a plan view showing a layout example which can provide the equivalent characteristic fluctuation suppressing effect as that of the dual-gate transistor in which the light-shielding layer is divided to separate light-shielding layers;

FIG. 28 is a plan view showing a layout example (1) in which a light-shielding layer is divided according to a fourth exemplary embodiment;

FIG. 29 is a plan view showing a layout example (2) in which a light-shielding layer is divided according to the fourth exemplary embodiment; and FIG. 30 is a plan view showing a layout example (3) in which a light-shielding layer is divided according to the fourth exemplary embodiment.

DETAILED DESCRIPTION OF THE PREFERRED EMBODIMENTS

Figure 1B:
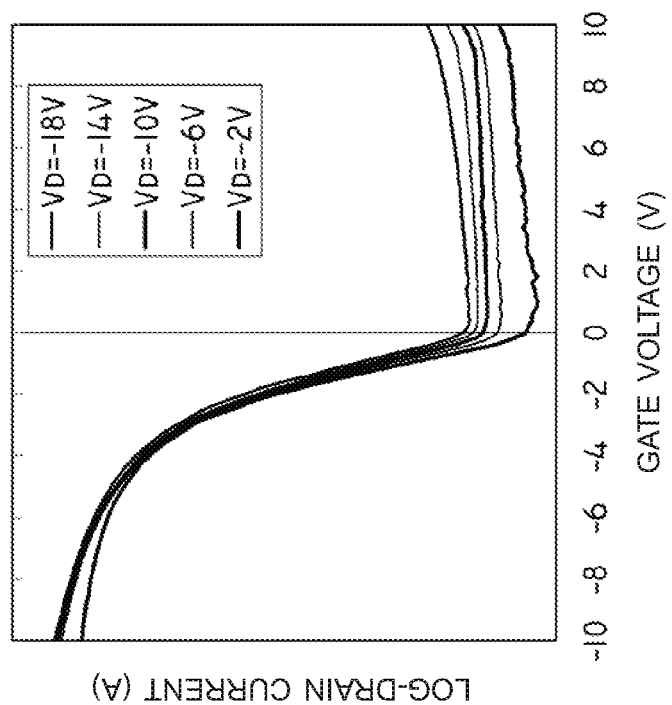
FIG. 1B is a graph showing the Id–Vg characteristic of the thin film transistor shown in FIG. 1A.

In the basic structure of the thin film transistor according to the present invention for overcoming the issues described above, a light-shielding layer formed with a high melting point metal or the like, an underlying insulating layer formed with silicon oxide (SiO) and silicon nitride (SiN), a polycrystalline silicon (Poly-Si) layer to be an active layer of the transistor, a gate insulating film formed with silicon oxide or silicon nitride, and a gate electrode are stacked on a glass substrate in this order. Further, on the upper layer thereof, an interlayer insulating film, a drain wiring, and the like are formed. The polycrystalline silicon layer is patterned into an island shape. A section intersecting with the gate electrode in the center of the polycrystalline silicon layer is a channel region, sections containing high-concentration of impurity at both ends of the polycrystalline silicon layer are source-drain regions, and sections between the channel region and the source-drain regions are LDD regions containing low-concentration of impurity. The source-drain region is ohmic-connected to the drain wiring of the upper layer via a contact hole. The light-shielding layer is located under the island pattern of the polycrystalline silicon layer, and processed into a shape which covers at least the channel region and the LDD region and to have a prescribed amount of projection towards the periphery of those regions. Further, the light-shielding layer is in a floating state which is not conductive with other conductive layers.

Further, when used for driving the pixels in a display device such as a liquid crystal display, it is effective to employ the so-called multi-gate transistor acquired by connecting a plurality of thin film transistors of such structure in series (dual-gate transistor when two transistors are connected in series).

The light-shielding layer used for such thin film transistor is a thin film formed with a high melting point metal selected based on the process adaptability, an alloy of such metals, or an intermetallic compound of those metals. The film thickness of the thin film is required to be at least 70 nm in a case of a chromium (Cr) film deposited by sputtering. It is preferable to be 100 nm or more, and more preferable to be 140 nm or more. These values are about the same for other materials as well. Note that the film thickness may be selected according to the operating conditions of the device to be applied. It is preferable to select a sufficiently large value when used with still higher luminance.

The size of the light-shielding layer is set to be projected out from the peripheral lines of the channel region and the LDD region of the active layer at least by 1.5 µm and more preferable to be by 2.0 µm. This makes it possible to suppress the influence of the leakage current caused by the light entered from the end of the light-shielding layer into the inner side.

The total film thickness of the underlying insulating layer is set to fall at least within a range of 200 nm to 500 nm, both inclusive, and more preferably to be set to fall within a range of 300 nm to 400 nm, both inclusive. The lower limit is determined mainly by the process adaptability, and it is preferable to be 300 nm or more for stable implementation of the process. The upper limit is determined mainly by the restriction in terms of the execution and the light-shielding characteristic. The upper limit in terms of the process time, the equipment load, and the like is up to 500 nm, and it is preferable to be 400 nm or less for a fine light-shielding performance. By the light-shielding layer and the underlying insulating layer, the directly emitted light from the backlight to the channel region and the LDD region as the photo-carrier generating regions of the active layer can be suppressed.

The overlapping area between the light-shielding layer and the gate electrode (including the wiring part) is determined according to a relational expression including the overlapping area between the light-shielding layer and the drain region. In the present invention, the proportion of the change in the threshold voltage of the transistor caused by the drain voltage is taken as the indicator of the characteristic fluctuation. In a case of PMOS (P-channel Metal Oxide Semiconductor), the fluctuation width dVth of the threshold voltage when the drain voltage is changed in a range of 16 V from −2 V to −18 V is taken as the indicator of the characteristic fluctuation. The threshold voltage can be expressed with the gate voltage Vg when the drain current Id is $1\times10^{-7}$ A in a case where the transistor with the channel length (L)=4 µm and the channel width (W)=4 µm is taken as the reference and L:W is defined as 1:1.

The relational expression in a case of a dual-gate transistor is (Expression 1) shown in the followings.

$$dVth = \alpha \cdot \ln(Sg/Sd) + \beta$$

$$\alpha = -0.108/tul + 0.00929$$

$$\beta = 0.351/tul + 0.277 \quad \text{(Expression 1)}$$

dVth: Fluctuation width (V) of threshold voltage Vth in range of Vd=−2 V to −18 V Sg: Opposing area of light-shielding layer and gate layer (µm²)

Sd: Opposing area of light-shielding layer and drain region (µm²)

tul: Thickness of underlying insulating layer (µm)

The relational expression in a case of a single-gate transistor is (Expression 2) shown in the followings.

$$dVth = \alpha \cdot \ln(Sg/Sd) + \beta$$

$$\alpha = -0.153/tul + 0.103$$

$$\beta = 0.659/tul - 0.107 \quad \text{(Expression 2)}$$

dVth: Fluctuation width (V) of threshold voltage Vth in range of Vd=−2 V to −18 V Sg: Opposing area of light-shielding layer and gate layer (µm²)

Sd: Opposing area of light-shielding layer and drain region (µm²)

tul: Thickness of underlying insulating layer (µm)

In the above, Sg does not include the area of the section where the gate layer (gate electrode including the gate line) that overlaps with the channel region of the thin film transistor opposes to the light-shielding layer. In other words, it is the area of the section where the gate layer (gate electrode including the gate line) opposes to the light-shielding layer via only the underlying insulating film and the gate insulating film.

When the dual-gate transistor is used for the pixel of the liquid crystal display, it is preferable to set the layout in such a manner that the Sg/Sd ratio becomes 4.7 or more when the underlying insulating layer is 400 nm and that the Sg/Sd ratio becomes 7.3 or more when the underlying insulating layer is 300 nm based on the above described Expression 1. Through employing such layout, the characteristic fluctuation comes to satisfy dVth≤0.75 V. Thus, the transistor characteristic falls within the operation margin even when the fluctuation at the time of manufacture and the characteristic changes and the like in a long-term use are taken into consideration, so that stable operations and excellent display qualities can be secured.

When the single-gate transistor is used, it is preferable to set the layout in such a manner that the Sg/Sd ratio becomes 17 or more when the underlying insulating layer is 400 nm and that the Sg/Sd ratio becomes 27 or more when the underlying insulating layer is 300 nm based on the above described Expression 2. Through employing such layout, the characteristic fluctuation comes to satisfy dVth≤0.75 V. Thus, the transistor characteristic falls within the operation margin even when the fluctuation at the time of manufacture and the characteristic changes and the like in a long-term use are taken into consideration, so that stable operations can be secured.

The light-shielding layer is separated between the neighboring pixels when used for the pixel transistor, and it is separated between the neighboring transistors having different functions when used for the transistor other than that. Thereby, the operation state of the neighboring pixel or the operation state of the neighboring transistor does not influence upon the characteristic of the transistor itself via the light-shielding layer.

In a case of the multi-gate transistor, if it is possible in terms of the layout, it is preferable to divide the light-shielding layer for each of the transistors. In the multi-gate transistor, the voltage between the source and the drain is divided for each of the transistors. Thus, by dividing the light-shielding layer for each of the transistors, the potential fluctuation in the light-shielding layer caused due to the drain voltage becomes limited only to the influence of the divided voltage. Therefore, the characteristic fluctuation can be suppressed further.

Further, in a case where the pixel transistor is formed with the multi-gate transistor and the light-shielding layer is divided, the layout is designed in such a manner that the Sg/Sd ratio of the transistor on the side closest to the pixel becomes large. When this is expressed by the static capacitance ratio, it can be rewritten as "the layout with which the Cg/Cd of the transistor on the side closest to the pixel becomes large, provided that the static capacitance between the light-shielding layer and the drain region is Cd and the static capacitance between the light-shielding layer and the gate line is Cg". Thereby, the characteristic fluctuation of the transistor on the side closest to the pixel is more suppressed and stabilized.

The first effect of the present invention is that it is possible to achieve high-quality display by lightening the contrast deterioration, crosstalk, flicker, and the like even in the display device that uses the high-luminance backlight.

The reason thereof is that the light leakage current of the thin film transistor caused by the direct irradiation of the high-luminance backlight can be prevented effectively so that the voltage change in a pixel holding period can be lightened. Further, the characteristic fluctuation even with the transistor having the light-shielding layer caused due to the operating conditions can be suppressed to be substantially equivalent to the case of the transistor having no light-shielding layer, so that the writing actions and the leakage current can become appropriate. Further, it is because the thin film transistor is not influenced by the neighboring pixels via the light-shielding layer.

The second effect of the present invention is that it is possible to suppress the cost increase to minimum and to prevent deterioration of the display quality.

The reason thereof is that it simply needs to form the light-shielding layer in the thin film transistor through employing the floating structure to the light-shielding layer, which is essential for dealing with the high-luminance backlight, so that a step of forming a connection structure for controlling the potential of the light-shielding layer becomes unnecessary. Further, it is because the conditions in which the influence of the process generated due to a step part of the light-shielding layer is taken into consideration are selected, so that generation of defects that leads to deterioration of the yield and the like can be suppressed.

Hereinafter, modes for embodying the present invention (referred to as "exemplary embodiments" hereinafter) will be described by referring to the accompanying drawings. In the current Specification and Drawings, same reference numerals are used for substantially the same structural elements. The shapes in the drawings are illustrated to be easily comprehended by those skilled in the art, so that the dimensions and ratios thereof are not necessarily consistent with the actual ones.

First Exemplary Embodiment

In a first exemplary embodiment, in order to suppress the characteristic fluctuation of the thin film transistor caused due to the existence of the floating light-shielding layer, i.e., in order to suppress the phenomenon where the threshold voltage changes depending on the drain voltage, the geometrical layout of the light-shielding layer is regulated. Specifically, the film thickness of the underlying insulating layer which determines the distance between the light-shielding layer and the active layer is set to be in a range of 200 nm to 500 nm, both inclusive, and more preferable to be in a range of 300 nm to 400 nm, both inclusive. On that condition, the ratio Sg/Sd (where the opposing area of the drain region of the active layer and the light-shielding layer is defined as Sd, and the opposing area of the gate electrode and the light-shielding layer is defined as Sg) is taken as an indicator expressed as the G/D ratio which is preferable to be set as 4.7 or more and more preferable to be set as 7.3 or more. Hereinafter, the characteristic fluctuation of the thin film transistor will be discussed. Thereafter, the reasons why those ranges are preferable will be described while explaining the structure of the thin film transistor and the simple manufacture process necessary for understanding the first exemplary embodiment.

First, described is a measurement example of a case where the transistor characteristic fluctuates depending on the drain voltage (Vd) when the light-shielding layer exists. The test transistor used for the measurement is a planar shape as shown in FIG. 1A, and it is a PMOS-TFT of an LDD structure on both sides in which a gate electrode 4 is provided on a polycrystalline silicon active layer 5 of 30 nm in film thickness via a silicon oxide (SiO) gate insulating film (see reference numeral 24 of FIG. 6) of 120 nm in film thickness. A channel region 1 is 4 µm in length (L) and 4 µm in width (W), and an LDD region 2 is 1.0 µm in length. Each of the both ends of the active layer 5 is a source-drain region 3. In practice, there are also interlayer insulating film and a wiring layer. However, explanations other than the main parts of the transistor are omitted herein.

Figure 1A:
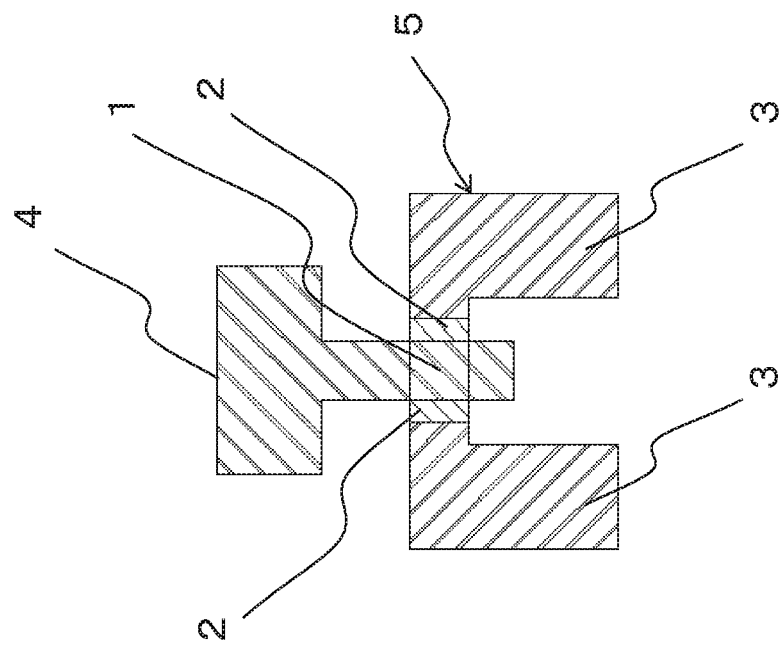
FIG. 1A is a plan view showing a thin film transistor with no light-shielding layer.

FIG. 1B shows a drain current Id-gate voltage Vg characteristic when the drain voltage Vd is changed in a range of −2 V to −18 V. The threshold voltage (Vth) defined with the gate voltage when $Id=1\times10^{-7}$ A is about −3.0 V when Vd=−10 V, and the fluctuation width (defined as dVth, and will be used in explanations provided later) of Vth generated according to the change in Vd is as small as about 0.3 V.

Figure 2B:
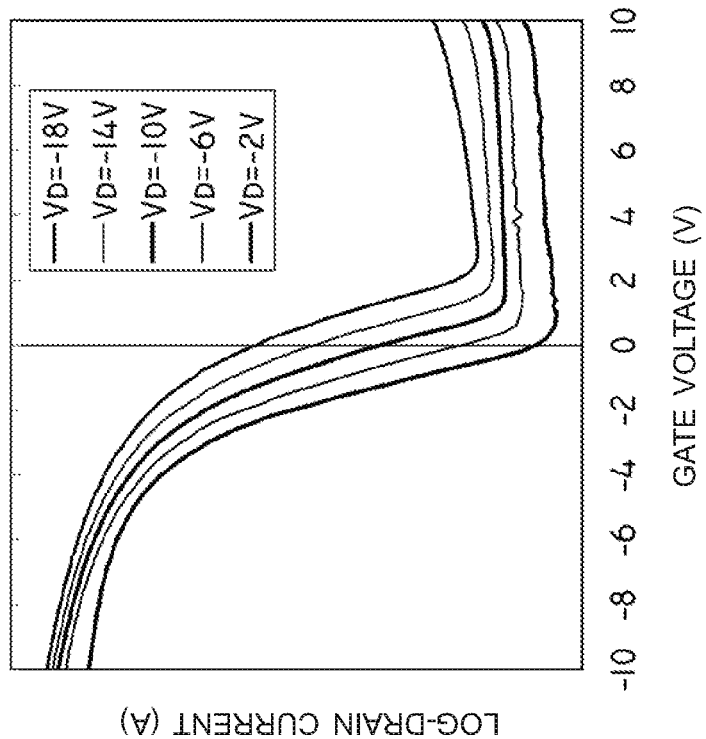
FIG. 2B is a graph showing the Id–Vg characteristic of the thin film transistor shown in FIG. 2A.
Figure 2A:
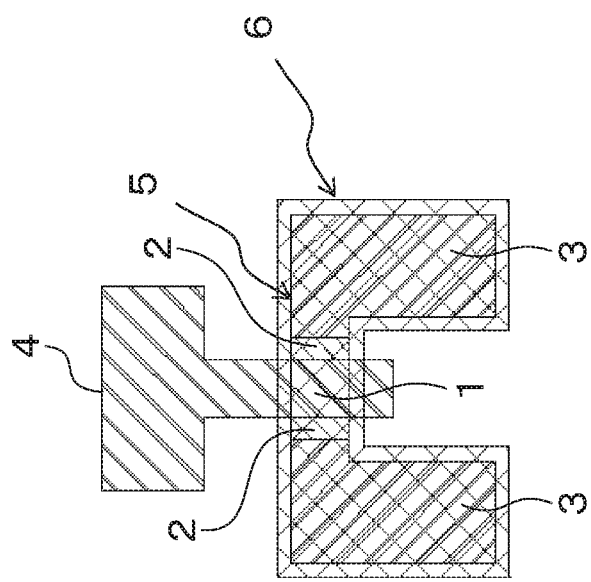
FIG. 2A is a plan view showing a thin film transistor with a light-shielding layer.
Figure 8:
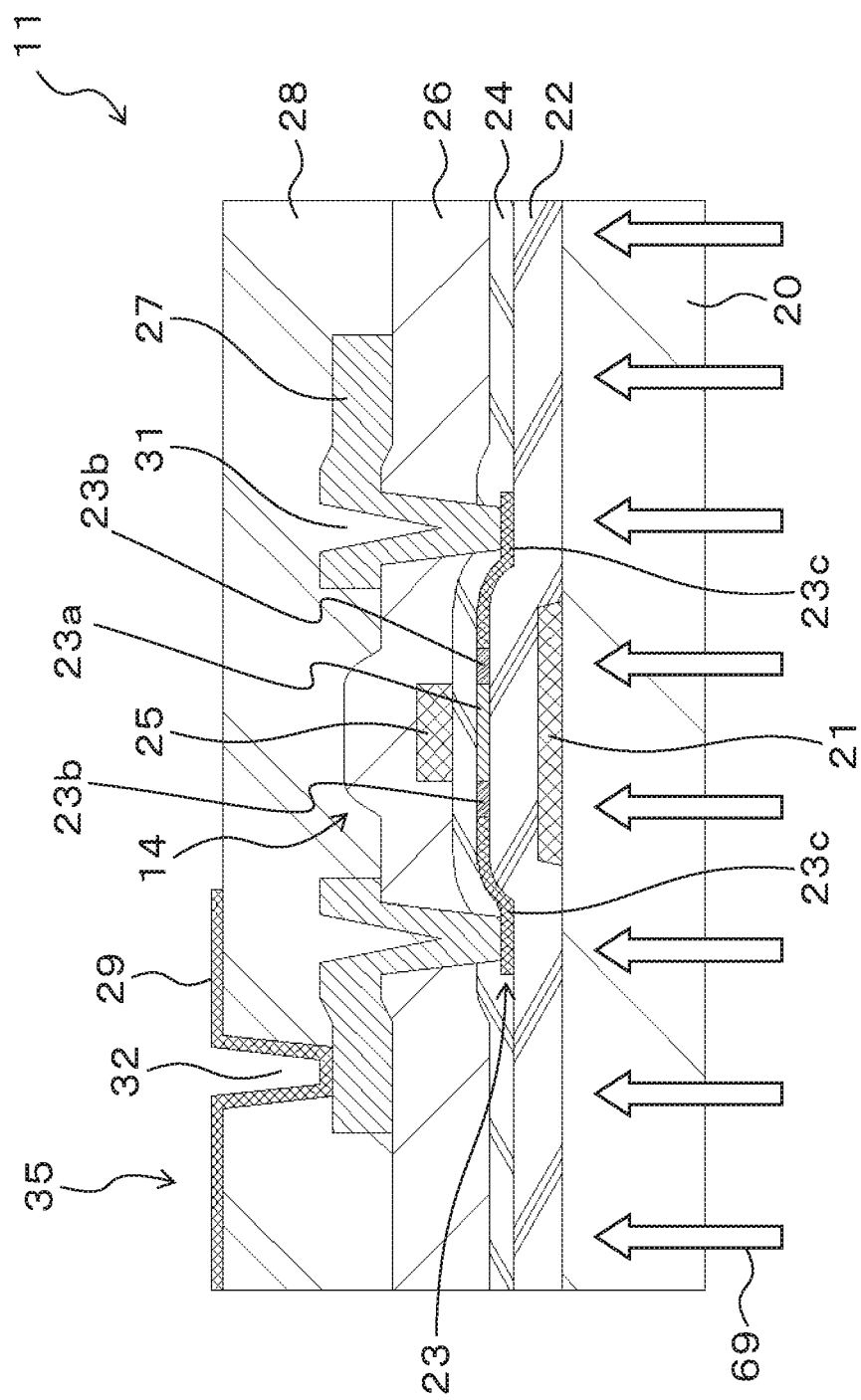
FIG. 8 is a sectional view showing a basic structure of the thin film transistor according to a first exemplary embodiment.

For a transistor in the same structure and the size of the transistor shown in FIG. 1A, a light-shielding layer 6 in a floating state was placed under the active layer 5 by facing the entire surface of the active layer 5 as shown in FIG. 2A via a stacked film of 400 nm in which silicon oxide (SiO) and silicon nitride (SiN) were stacked as an underlying insulating layer (see reference numeral 22 of FIG. 8). FIG. 2B shows the measurement result of the thin film transistor shown in FIG. 2A.

In the thin film transistor having the light-shielding layer 6, the threshold voltage (Vth) when Vd=−10 V is about −2 V, i.e., shifted by about 1 V towards the plus side, compared to the case of the thin film transistor having no light-shielding layer 6. In addition, the fluctuation width (dVth) of the threshold voltage when Vd is changed in a range of −2 V to −18 V is about 2.3 V, i.e., increased by about seven times.

This result was acquired when the light-shielding layer 6 was placed simply to prevent incident of light to the active layer 5 without any devising. Further, this results shows that a large leakage current (see FIG. 2B) flows at Vg=+2 V on the plus side that is originally an off region (see FIG. 1B) depending on the drain voltage. This leakage current is not a light leakage current but a current generated due to the characteristic fluctuation of the transistor.

Under a high-luminance backlight, it is the first concern to suppress the light leakage current generated by direct light rays with the light-shielding layer. Then, it is desired to suppress the phenomenon where the transistor characteristic changes when the light-shielding layer comes to have the potential influenced by the drain voltage. That is, if the Vd-dependent characteristic fluctuation caused can be suppressed, not only the decrease in the leakage current of the off region but also the operation state can be stabilized as a whole. Thus, there is a possibility for the thin film transistor to be utilized as not only the pixel transistor but also as the transistor constituting a circuit in a case of being employed to a liquid crystal display as well.

Here, a display device according to the first exemplary embodiment will be described. FIG. 3 is a sectional view for describing the structure of a display device 60 that uses an active-matrix type liquid crystal panel 67. The display device 60 is mounted into various electronic apparatuses, and displays images according to image signals received from the electronic apparatuses. A backlight unit 63 functioning also as a frame that supports the entire device has an LED to be a light source, a light guiding plate, a diffuser, and the like (each of those sections is not shown) mounted thereto, and generates uniform light to the display region (not shown) of the liquid crystal panel 67. The liquid crystal panel 67 is fixed on the backlight unit 63.

In the liquid crystal panel 67, liquid crystal (see reference numeral 13 of FIG. 5) is inserted between a color filter substrate 62 for providing color display and a TFT array substrate 61 where wirings for controlling the display, thin film transistors, and the like are formed, and a polarization plate 64 is laminated to the both ends thereof. Pixel electrodes connected to the thin film transistors are placed in matrix in the display region of the TFT array substrate 61, and liquid crystal molecules are moved by the voltage controlled by the thin film transistors to provide display. For the thin film transistor that drives the pixel, a gate driver circuit formed by the same process supplies on/off signals.

The image signals to be displayed are supplied from a driver IC 65 mounted to the circumference part of the TFT array substrate 61. Further, the image signals from the electronic apparatus to which the display device 60 is mounted are transmitted to the display device 60 via an FPC (Flexible Printed Circuits) 66 connected to the TFT array substrate 61. The driver IC 65 and the FPC 66 are both fixed mechanically by ACF (Anisotropic Conductive Film), and a great number of terminals are electrically connected to the terminals on the TFT array substrate 61.

Further, as an example of a case using a high-luminance backlight in particular, another display device of the first exemplary embodiment will be described. FIG. 4 is a conceptual diagram for describing a display device that is a head-up display 70 using an active-matrix type liquid crystal panel 77. The displayed image of the liquid crystal panel 77 is reflected by a plan mirror 75, a concave mirror 76, and a combiner 74, and a virtual image 73 is viewed by an observer 72 as if it is located on the far side of the combiner 74. The combiner 74 is transparent, so that the observer 72 can simultaneously view the sight in front and the display image on the liquid crystal panel 77. A specific use example may be a case where a pilot of an airplane or a driver of a vehicle can see the information regarding the operation and driving overlapped with the sight in front from the pilot's seat or the driver's seat. The front glass of the airplane or the vehicle may also function as the combiner 74 in some cases.

When used in the airplanes or vehicles, the backlight unit 71 must be a strong light source in order to acquire fine display visibility since the device is used outdoor and under sunlight, the combiner 74 is transparent (reflection light is relatively small), and the like. Further, there is the concave mirror 76 in the reflection optical system, which works to expand the display of the liquid crystal panel 77. Thus, it is required to pass the necessary amount of light through the liquid crystal panel 77 that is smaller than the size to be visually recognized.

The backlight unit 63 of a direct-view type like the display device 60 shown in FIG. 3 has the luminance of about 10,000 to 20,000 $cd/m^2$ at the utmost. In the meantime, the backlight unit 71 of the head-up display 70 shown in FIG. 4 has the luminance of 1,000,000 $cd/m^2$ at the minimum. As will be described later, the light-shielding layer is necessary for the thin film transistor used in the liquid crystal panel 77 that is exposed to irradiation of the light.

Figure 5:
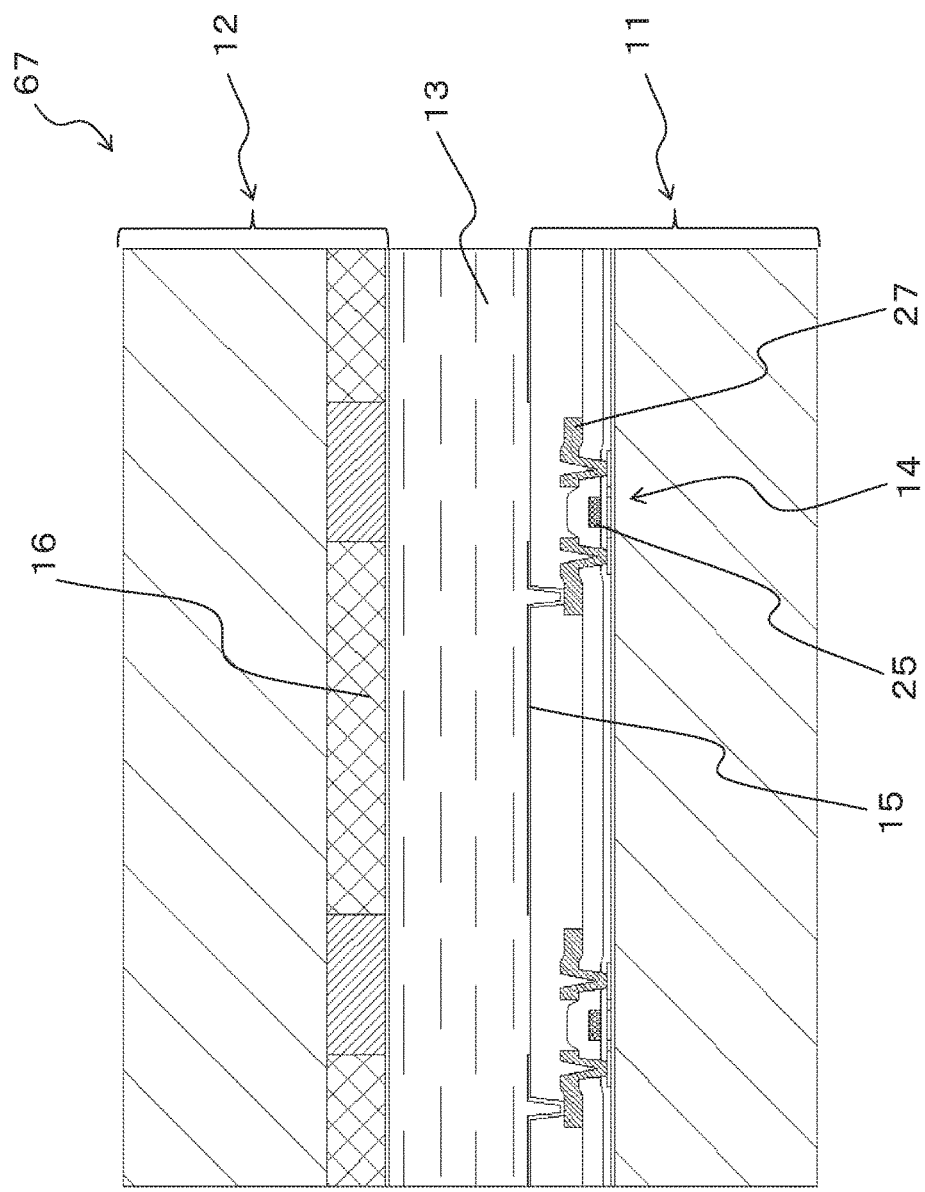
FIG. 5 is a sectional view showing a basic structure of a liquid crystal panel.

Next, the basic structure of the active-matrix type liquid crystal panel 67 (FIG. 3) will be described. FIG. 5 is a conceptual diagram showing an enlarged sectional view of the liquid crystal panel 67. A TFT array substrate 11 and a color filter substrate 12 in FIG. 5 correspond to the TFT array substrate 61 and the color filter substrate 62 in FIG. 3.

The liquid crystal panel 67 has a structure in which liquid crystal 13 is filled and sealed between the TFT array substrate 11 and the color filter substrate 12. Pixel transistors 14 and pixel electrodes 15 are placed in matrix on the TFT array substrate 11, and molecules of the liquid crystal 13 are driven by electric fields generated by voltages applied to the pixel electrodes 15. A gate electrode 25 of the pixel transistor 14 is connected to the output line of the gate driver circuit described above, and a drain wiring 27 is connected to the output terminal of the driver IC 65 (FIG. 3).

In the color filter substrate 12, a color filter 16 corresponding to three primary colors (R, G, B) of light is formed at a position opposing to the pixel electrode 15. The polarization plate 64 (FIG. 3) is laminated to the both faces of the liquid crystal panel 67, and the transmittance of each pixel can be controlled by driving the molecules of the liquid crystal 13. Each pixel controls the light from the backlight unit 63 (FIG. 3) placed under the TFT array substrate 11, and the color filter 16 limits the wavelength to be transmitted through so as to display a full color image.

Next, the basic structure of the pixel transistor necessary for explaining the first exemplary embodiment will be described.

Figure 6:
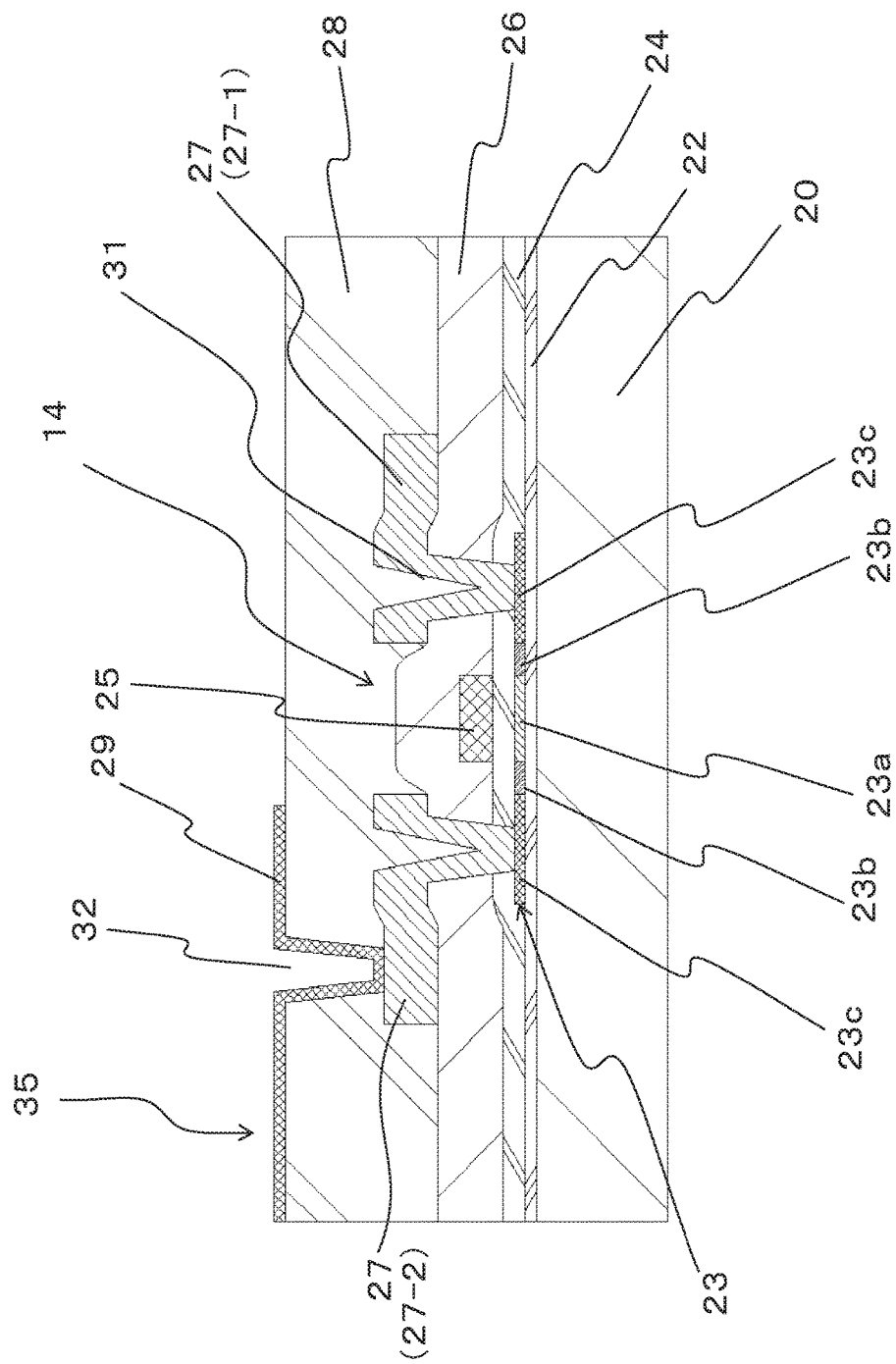
FIG. 6 is a sectional view showing a basic structure of a pixel transistor.

FIG. 6 is a conceptual diagram showing a still enlarged sectional view of the pixel transistor part of the TFT array substrate. For describing the stacking structure, a single-gate structure having a single gate is illustrated herein. The underlying insulating layer 22 is formed on a glass substrate 20, and the pixel transistor 14 is provided thereon. In the pixel transistor 14, a polycrystalline silicon active layer 23, a gate insulating film 24, the gate electrode 25, a first insulating film 26, the drain wiring 27, a second insulating film 28, and the pixel electrode 29 are stacked from a lower layer. The active layer 23 is divided into a channel region 23a under the gate electrode 25, a source-drain region 23c for being connected to the drain wiring 27, and an LDD region 23b located between the channel region 23a and the source-drain region 23c.

The drain wiring 27 is connected to the source-drain region 23c via a first contact 31 opened in the gate insulating film 24 and the first interlayer film 26. A pixel electrode 29 is connected to the drain wiring 27 via a second contact 32 opened in the second interlayer film 28, and it is connected through to the source-drain region 23c via the drain wiring 27. The light emitted from the backlight unit 63 (FIG. 3) not only contributes to display by pass through a transmissive region 35 constituted with a transparent insulating film such as the first interlayer film 26 and the pixel electrode 29 but also makes incident on the back surface of the active layer 23 by being irradiated to the back surface (glass substrate 20 side) of the pixel transistor 14.

Figure 7:
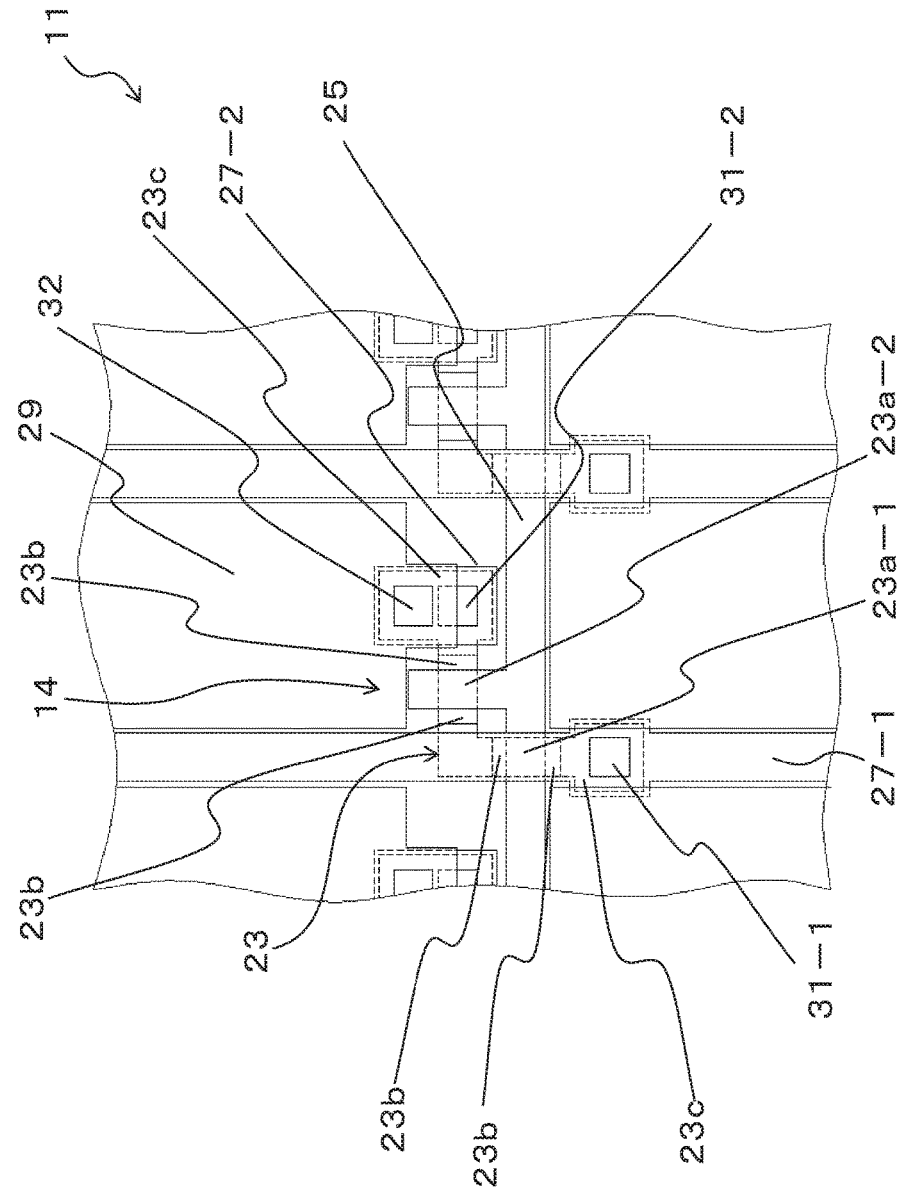
FIG. 7 is a plan view showing a structure in the vicinity of a pixel transistor of a TFT array substrate.

FIG. 7 is an enlarged plan view of the pixel transistor part of the TFT array substrate. The same elements as those of the sectional view of FIG. 6 are shown with the same numbers. Herein, the pixel transistor is illustrated as a dual-gate structure that is used often for the actual pixels. In FIG. 7, the active layer 23 of the pixel transistor 14 is placed by being bent in an L-letter shape, and two channel regions 23a-1 and 23a-2 are connected in series.

The gate electrode 25 is a part of the gate line, and overlaps with the active layer 23 in the channel regions 23a-1 and 23a-2. The source-drain region 23c functioning as a conductive layer exists in the both ends and the middle section of the active layer 23, and the LDD region 23b is formed between the source-drain region 23c and the channel regions 23a-1, 23a-2, respectively. One of the source-drain region 23c is connected to a data line 27-1 (drain wiring 27) at a first contact 31-1. The other source-drain region 23c is connected to a drain layer 27-2 at a first contact 31-2, and connected to the pixel electrode 29 at a second contact 32 via the drain layer 27-2.

The basic actions of the pixel transistor 14 will be described. When a gate line (gate electrode 25) is selected, a voltage to turn on the pixel transistor 14 is applied to the selected gate line. When the gate electrode 25 in FIG. 7 is turned to an on-voltage, the channel regions 23a-1 and 23a-2 in two sections become conductive, and the voltage (image signal) of the data line 27-1 is charged to the pixel electrode 29 via the active layer 23. When the selected period ends, a voltage to set off the pixel transistor 14 is applied to the gate line, and the pixel transistor 14 is to hold the potential of the pixel electrode 29 during one frame until this gate line is selected next. At this time, even under an off-state, a small amount of leakage current flows in the pixel transistor 14. However, when the voltage change caused due to the leakage current in one frame period is in a range that can be ignored for display, it is considered that there is substantially no influence of the leakage current.

In the explanation of FIG. 6 provided above, it is described that the light from the backlight also makes incident on the back surface of the active layer 23. Irradiation of light to the semiconductor causes generation of photo-carriers, and a leakage current caused due to the light is generated when the carriers flow into the source-drain regions 23c. The light leakage current is not an issue when the change in the pixel voltage caused by the light leakage current is within a range that can be ignored for display. However, in a case where the display luminance is maintained by increasing the luminance of the backlight when the aperture ratio is decreased for achieving a high-definition display and a case where reflection of a glass surface is utilized under a bright environment such as a case of head-up display, a backlight that is remarkably brighter than the conventional use is required. Thus, the influence of the light leakage current cannot be ignored any more in such cases.

The sections of the active layer 23 where the photo-carriers are generated are the channel region 23a and the LDD region 23b. In order to decrease the light leakage current, the light-shielding layer for blocking the light making incident on those sections is employed. As shown in FIG. 8, the light-shielding layer 21 is formed on the glass substrate 20 and provided at a position and in a shape to cover the channel region 23a and the LDD region 23b of the active layer 23.

The first exemplary embodiment is a proposal indicating that it is necessary to provide a comprehensive design which not only considers the basic light-shielding performance of the light-shielding layer but also considers the points regarding concerns for the process adaptability and suppression of the TFT characteristic fluctuation. Successively, the points regarding the light-shielding layer will be described in details by following the manufacture flow.

The basic process will be described by referring to a coplanar-type PMOS thin film transistor having an LDD structure of low-temperature polycrystalline silicon. However, the technique is also applicable to NMOS. Washing is essential in each process, however, explanations of typical washing done before depositing, before applying photoresist, and the like will be omitted.

First, a metal film to be the light-shielding layer is formed on a glass substrate by sputtering. Alkali-free glass is used for the glass substrate. If shrinkage in a heat step is concerned, anneal glass can be selected for reducing the shrinkage of the glass substrate during the process. As a material for the light-shielding layer, it is suitable to use high melting point metals such as chromium (Cr), molybdenum (Mo), tungsten (W), niobium (Nb), and the like, alloys having those as the main components, intermetallic compounds having those as the main components, etc., since the materials are required to resist the temperatures of about 400 to 500° C. at the highest in the process. Further, the use of the same material for that of the gate electrode used hereinafter can provide an advantage in terms of the device management and operations of the manufacture steps.

The film thickness of the light-shielding layer may be selected depending on the transmittance (light-shielding characteristic) of the material and the specification of the backlight. For example, according to the result acquired by actually forming a chromium (Cr) film deposited by sputtering, the yardstick for selecting the film thickness is at least 70 nm, preferably 100 nm or more, and 140 nm for more certainty. The film thickness of the other high melting point materials is substantially the same. Herein, a chromium film of 100 nm in thickness is used. This film thickness is the origin for a step part in the foundation where polycrystalline silicon is formed, so that it is necessary to consider it along with the film thickness of the underlying insulting layer formed hereinafter.

Figure 9:
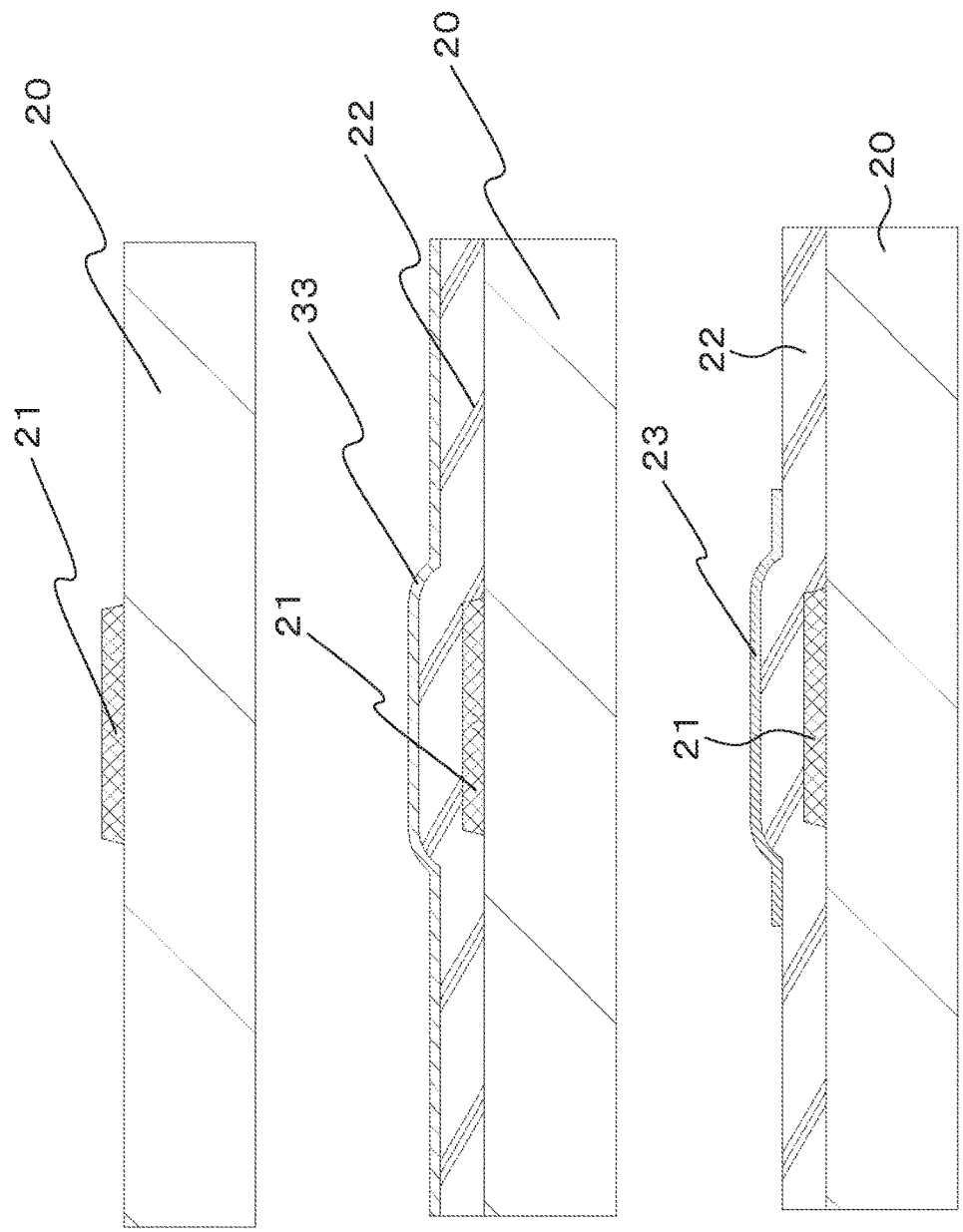
FIG. 9A is a sectional view showing a manufacture process (1) of the thin film transistor according to the first exemplary embodiment.
FIG. 9B is a sectional view showing a manufacture process (2) of the thin film transistor according to the first exemplary embodiment.
FIG. 9C is a sectional view showing a manufacture process (3) of the thin film transistor according to the first exemplary embodiment.

As shown in FIG. 9A, the chromium film deposited on the glass substrate 20 by sputtering is patterned into the light-shielding layer 21 by photolithography and etching at the position of the channel region and the LDD region of the active layer formed thereafter. At this time, the light-shielding layer 21 is formed as an isolated pattern separated between the neighboring sub-pixels. Etching used herein is wet-etching.

Subsequently, as shown in FIG. 9B, the underlying insulating layer 22 to be the lowermost layer for adjusting the film thickness and an amorphous silicon film 33 for forming the active layer are formed by using plasma CVD. For simplifying the comparison experiment and dispersing the load of the device at the time of production, the underlying insulating layer 22 is formed as a stacked film of a silicon oxide film, a silicon nitride film, and a silicon oxide film.

The underlying insulating layer 22 is formed as a stacked film of 300 nm in total film thickness in which silicon oxide of 150 nm, silicon nitride of 50 nm, and silicon oxide of 100 nm are stacked in this order from a lower layer. The silicon nitride film prevents diffusion of impurity to the active layer from the glass substrate 20. The silicon oxide film directly under the amorphous silicon film 33 improves the sticking force between the silicon nitride film and the amorphous silicon film 33. The film thickness of the amorphous silicon film 33 is formed to be relatively thin for decreasing the light leakage current. The generation amount of the photo-carriers by irradiation of light is determined by the volume of the section later to be the channel region 23a and the LDD region 23b (FIG. 6), i.e., the volume of the amorphous silicon film 33. Thus, in view of the light leakage current, the film thickness is preferable to be thin. However, in the process of crystallization, control of the impurity concentration by implanting ions, forming a contact structure, and the like, it is difficult to achieve stable manufacture when the film thickness is extremely thin. From such point of view, selected is the film thickness of 30 nm which is a range capable of achieving stable manufacture and is relatively thin.

Subsequently, the amorphous silicon film 33 is crystallized. Excimer laser anneal (ELA) is used for crystallization. The excimer laser gives pulse discharge to a mixed gas of a rare gas and halogen to provide oscillation by the generated radiation light. The amorphous silicon film 33 to which the laser light is irradiated is instantly melted and solidified to turn into a polycrystalline silicon film. To set the basic threshold voltage of the transistor, the concentration of impurity in the polycrystalline silicon (or the amorphous silicon film 33 before being crystallized) is controlled by using ion implantation. To change the threshold voltage to the plus side, boron (B) may be implanted to the entire surface of the film. To change the threshold voltage to the minus side, phosphor (P) may be implanted to the entire surface of the film.

Here, the points to keep in mind at the time of ELA will be described. When there is no light-shielding layer 21, crystallization is done on the amorphous silicon film 33 on a flat surface. In the meantime, when there is the light-shielding layer 21 as in the first exemplary embodiment, crystallization is done on the amorphous silicon film 33 on an uneven surface. The uneven surface is caused due to a step part generated by the film thickness of the light-shielding layer 21. With the crystallization done by ELA as described above, the silicon film is melted instantly to be in a liquid phase. The liquid surface at this time is to shrink by surface tension. On the flat surface having no light-shielding layer 21, the balance of the surface tension is maintained. Thus, there is no remarkable change in the melted-state silicon.

Figure 13:
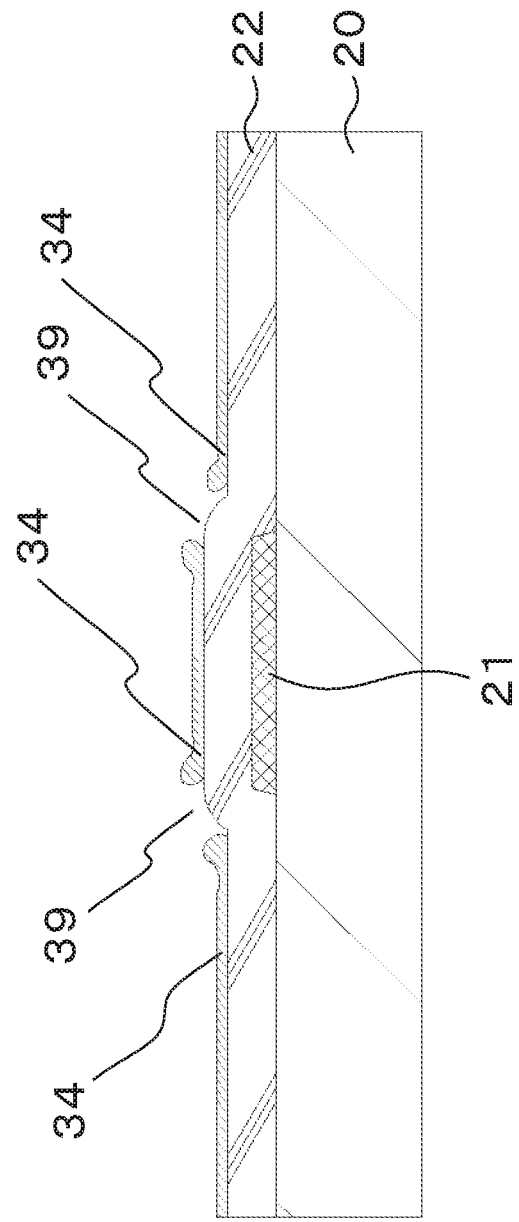
FIG. 13 is a sectional view showing ruptures of a silicon film caused in a crystallization step.

However, the melted-state silicon when there is the light-shielding layer 21 is flown out by the surface tension at the protruded part of the corner of the step part so that the film thickness becomes thin. As shown in FIG. 13, when the corner is sharp, the silicon film 34 is solidified while having a ruptured part 39. If the region including the rupture part 39 is removed by patterning executed in a latter step, the influence thereof is small. However, in the first exemplary embodiment, as will be described later, the step part generated by the light-shielding layer is desired to be located in the source-drain region within the active layer. Therefore, in the first exemplary embodiment, it is required to use a process condition with which the rupture part 39 is not generated.

The film thickness of the light-shielding layer 21 affects the light-shielding performance, and it is the origin to be a step part formed in a crystallization step. The underlying insulating layer 22 directly over the light-shielding layer 21 is formed by plasma CVD. The plasma CVD film deposit in a relatively isotropic manner for the shape of the underlying, and deposited to round the corners of the ends of the light-shielding layer 21. This effect becomes more notable as the film thickness of the underlying insulating layer 22 is increased, so that the corner of the step part generated by the light-shielding layer 21 becomes gentler as the film thickness of the underlying insulating layer 22 is increased. Note, however, that the step part itself is not overcome.

The state of the film in the crystallization done by ELA was checked by an experiment. It is found as a result that at least 200 nm is required for the film thickness of the underlying insulating layer 22 for the film thickness of the light-shielding layer 21 in a range of 70 nm to 140 nm, and that 300 nm or more is preferable for more stable execution of the process. However, if the film thickness of the underlying insulating layer 22 is too thick, the process time is extended and the load for the equipment is increases. Thus, the thickness of about 500 nm is the upper limit for the actual implementation.

Subsequently, as shown in FIG. 9C, a polycrystalline silicon film is processed into the island-shaped active layer 23 by photolithography and dry etching.

Figure 10:
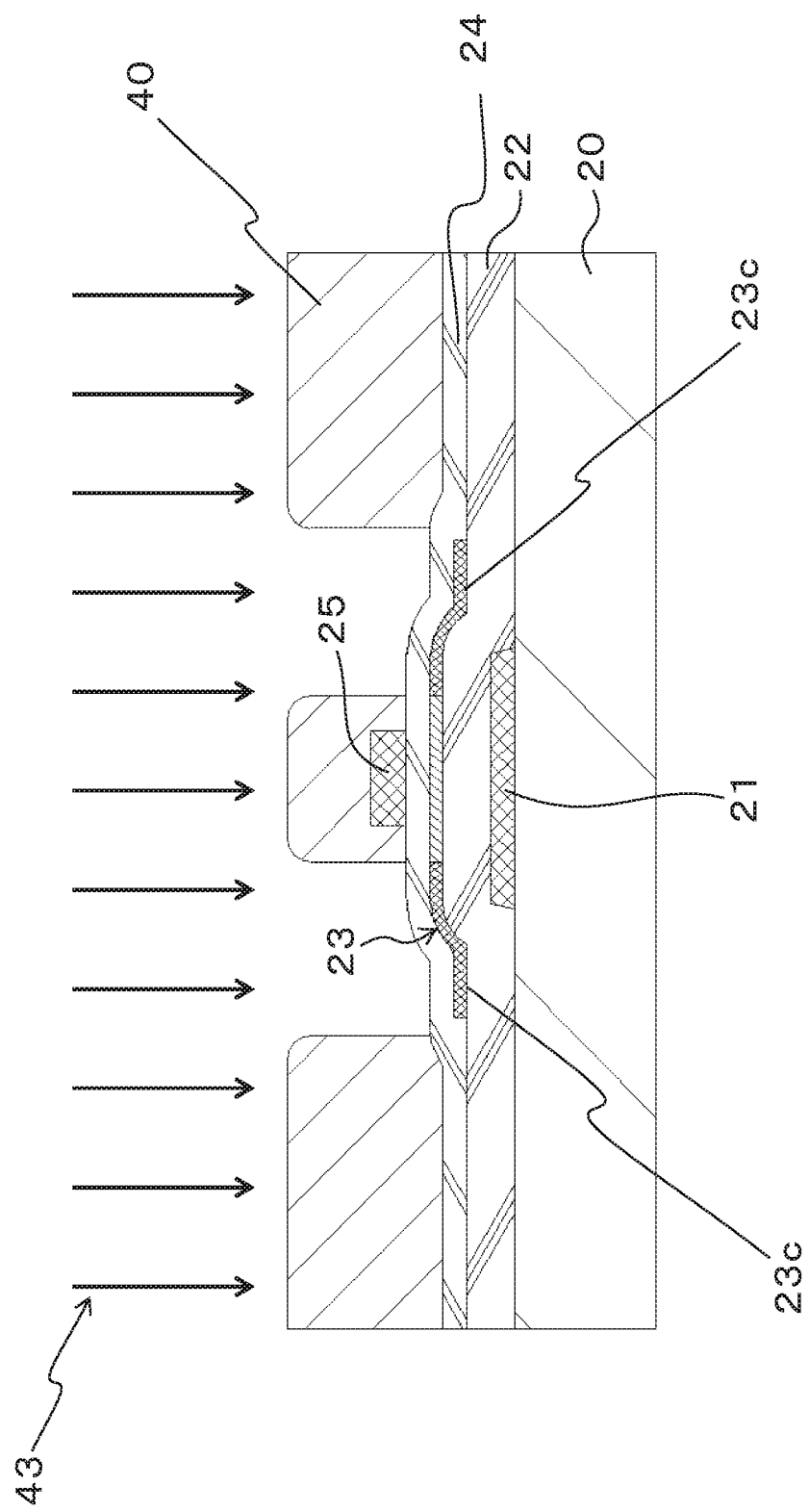
FIG. 10 is a sectional view showing a manufacture process (4) of the thin film transistor according to the first exemplary embodiment.

Then, as shown in FIG. 10, silicon oxide is deposited in 120 nm as the gate insulating film 24 by plasma CVD. Further, chromium is deposited in 200 nm by sputtering, and processed into the shape of the gate electrode 25 (including the gate line) by photolithography and wet etching. Dry etching may be used as well for the etching executed herein.

Subsequently, boron 43 is implanted as impurity to the active layer 23 to adjust the concentration in each region. First, after forming a resist pattern 40 by photolithography in which only the region to be the source-drain region 23c is opened, boron 43 is implanted t by ion implantation. At this time, the acceleration voltage is adjusted so that the depth peak of the boron 43 comes at the position of the active layer 23. Regarding the implantation amount of the boron 43 to the source-drain region 23c, preciseness is not required so much. Therefore, for this implantation process, ion shower which does not perform mass separation may be used.

Figure 11:
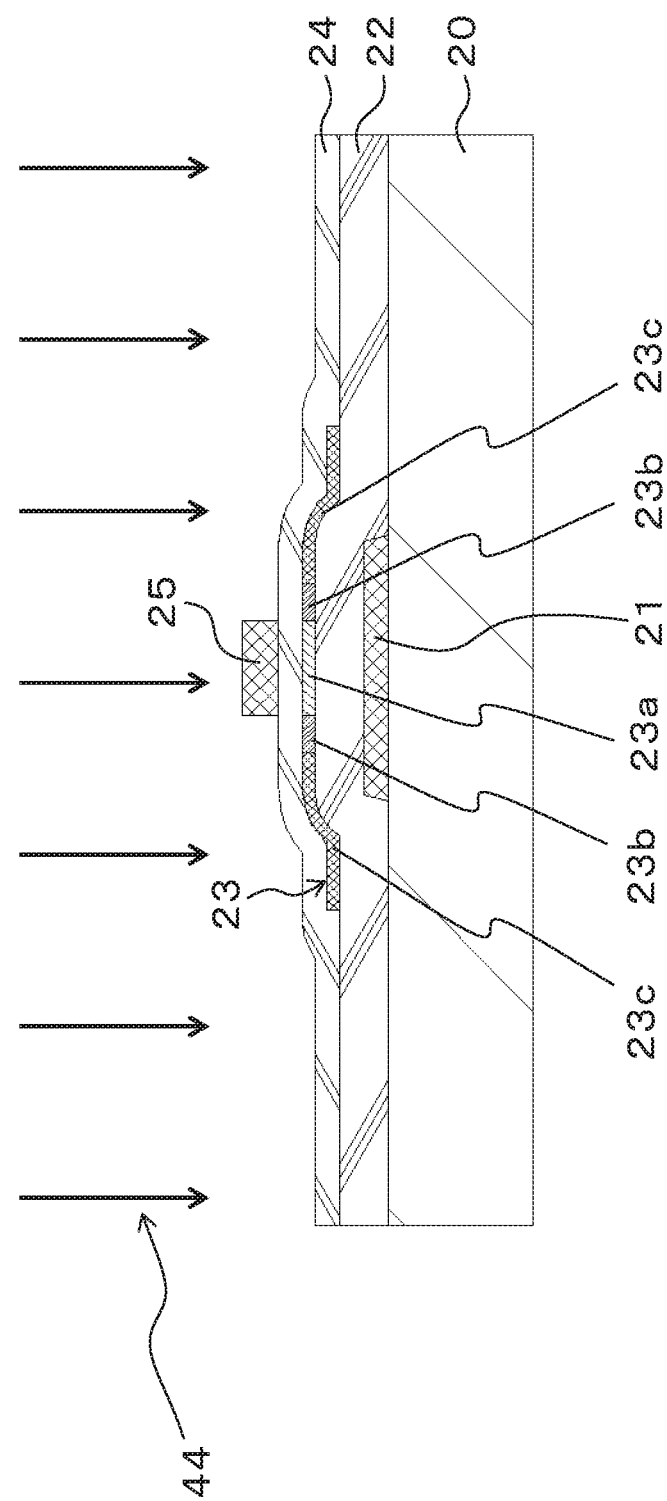
FIG. 11 is a sectional view showing a manufacture process (5) of the thin film transistor according to the first exemplary embodiment.

Subsequently, as shown in FIG. 11, boron 44 is implanted to the entire surface by ion implantation in a state where the resist pattern 40 is stripped. At this time, the gate electrode 25 is a mask for the channel region 23a. The boron of two order of magnitudes higher concentration is already implanted to the source-drain region 23c, so that the amount of the impurity implanted this time determines the impurity concentration of the LDD region 23b. The boundary between the LDD region 23b and the channel region 23a is determined by the gate electrode 25 in a self-alignment manner. Thereby, in the active layer 23, the part overlapping with the gate electrode 25 forms the channel region 23a, the both sides of the channel region 23a are the LDD regions 23b, and both ends are the source-drain regions 23c.

Figure 12:
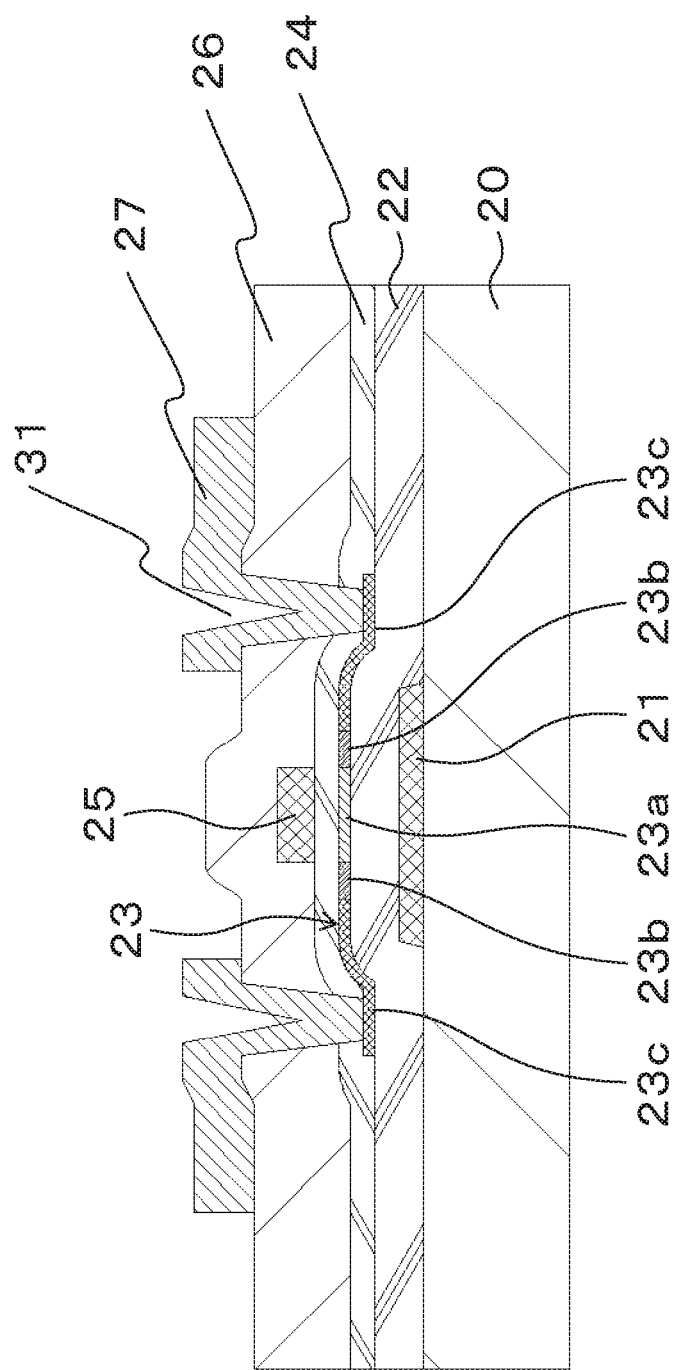
FIG. 12 is a sectional view showing a manufacture process (6) of the thin film transistor according to the first exemplary embodiment.

Subsequently, as shown in FIG. 12, silicon oxide to be the first interlayer film 26 is deposited in 400 nm by plasma CVD. The impurity (boron) implanted after crystallization of the polycrystalline silicon does not stay within the lattice position of crystal in the polycrystalline silicon film of the active layer 23, and does not function as the impurity in the crystal. Thus, by performing heat treatment in the inert atmosphere, the implanted impurity is diffused to be in the lattice position of crystal to be activated. In this case, heat treatment is applied by using a furnace of nitrogen atmosphere. Other than that, there is also a method of using RTA (Rapid Thermal Annealing).

Subsequently, it is exposed in hydrogen discharge while applying heat in a plasma CVD device to perform plasma processing. Thereby, hydrogen is diffused to terminate the dangling bond of the polycrystalline silicon. Therefore, the transistor characteristic is stabilized.

Subsequently, the first interlayer film 26 and the gate insulating film 24 are opened by photolithography and dry etching to form the first contact 31, a stacked film constituted with Ti, Al, and Ti is deposited by sputtering, and the drain wiring 27 is patterned by photolithography and dry etching.

Subsequently, as shown in FIG. 8, an organic film or the like is applied and cured to form the second interlayer film 28, the second contact 32 is opened thereon, an ITO film is deposited by sputtering, and it is patterned to the pixel electrode 29 by photolithography and wet etching. Thereby, the TFT array substrate 11 is completed.

Thereafter, as shown in FIG. 5, a polyimide alignment layer is printed/cured on the TFT array substrate 11 and the color filter substrate 12, rubbing is performed thereon, the liquid crystal 13 is filled in a gap formed by placing the TFT array substrate 11 and the color filter substrate 12 opposing to each other, and those are sealed. Thereby the liquid crystal panel 67 is acquired.

Note here that the function of the light-shielding layer 21, as shown in FIG. 8, is to block the light of the backlight 69 made incident from the bottom side of the glass substrate 20 so as not to irradiate the light of the backlight 69 to the channel region 23a and the LDD region 23b of the active layer 23. Thereby, the off leakage current of the pixel transistor 14 can maintain the level of the case where the light is not irradiated.

Regarding the process adaptability related to blocking the light and to the light leakage current, the parameter to be controlled mainly in the film thickness direction has been described heretofore by following the manufacture process of the TFT array substrate 11. Next, the restriction in the substrate in-plane direction related to the light leakage current will be described by referring to a plan view.

Figure 14:
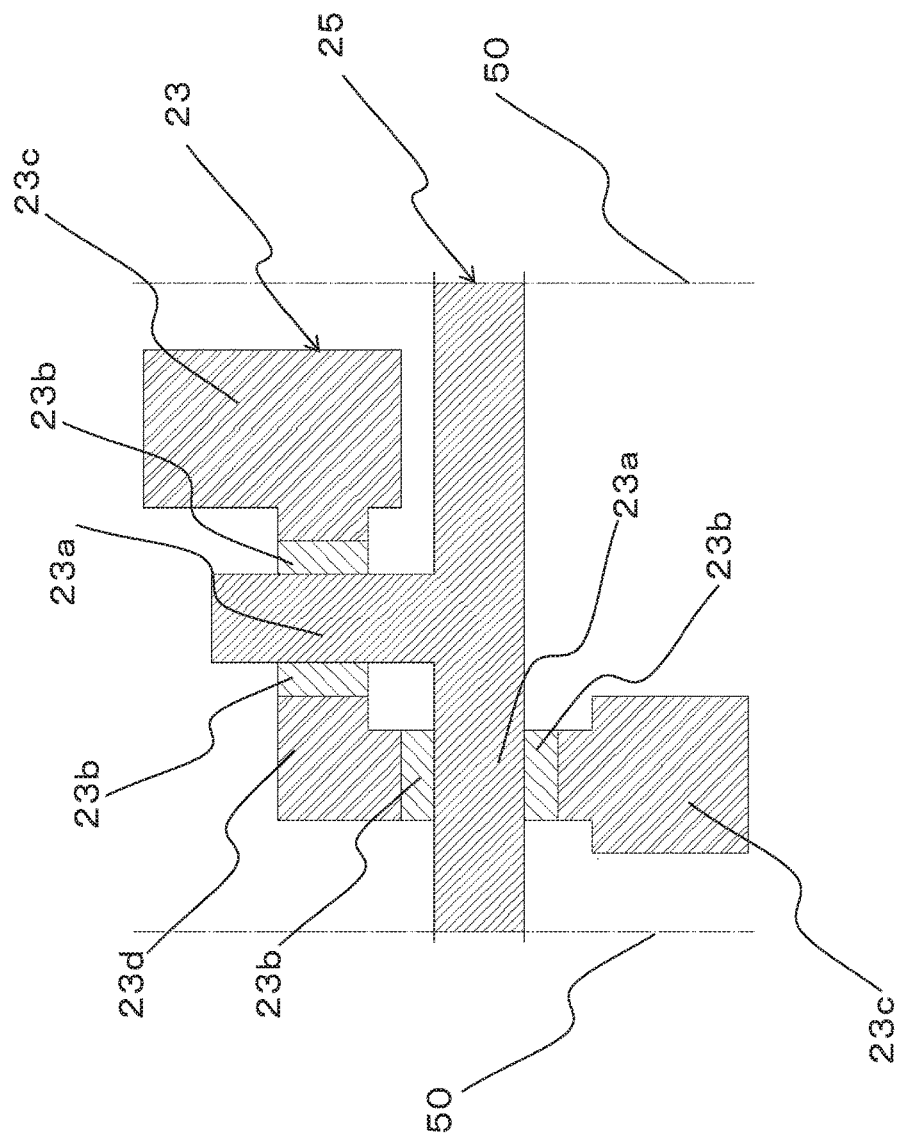
FIG. 14 is a plan view showing details of an active layer and a gate electrode of one sub-pixel.

The TFT array substrate 11 of the liquid crystal panel is in a structure as shown in FIG. 7 in a plan view. FIG. 14 shows a fragmentary view of the active layer 23 and one sub-pixel of the gate electrode 25 taken out therefrom. It is in a dual gate structure in which two transistors are connected in series.

The active layer 23 is separated as follows. The intersection part overlapped with the gate electrode 25 is the channel region 23a, the both sides of the channel region 23a are the LDD regions 23b, the both ends of the active layer 23 are the source-drain regions 23c, and the between the two transistors is the middle region 23d having the same impurity concentration as that of the source-drain region 23c. The border between the channel region 23a and the LDD region 23b and the edge of the electrode 25 are formed in a self-aligned manner by the impurity implantation process of the LDD, so that those are aligned without shift.

Note here that the both ends of the active layer 23 are called as the source-drain regions 23c. The reason is that a case where one of the both ends is the source and the other is the drain and a case where one of the both ends is inversely the drain and the other is the source change moment by moment according to the operation conditions. The first exemplary embodiment shows the case of the PMOS transistor, so that the transistor is in an on state when the gate voltage is a minus potential. Thus, in the explanations below, there may be cases where the reference potential side out of the source-drain regions 23c on both ends of the active layer 23 is simply referred to as the source region, and the minus potential side is simply referred to as the drain region.

Long and short dashed lines at both left and right ends in FIG. 14 are border lines 50. The space between those long and short dashed lines is taken as a lateral width (pitch) of one sub-pixel. In FIG. 14, the channel length (L) of one transistor is 4 μm, the channel width (W) is 4 μm, the length of the LDD region is 1.0 μm, and the pitch of the sub-pixels is 29 μm. To place the light-shielding layer by going over the border lines 50 in the left and right directions of the drawing means to interfere with the neighboring sub-pixels, and to expand the light-shielding layer in the top and bottom directions thoughtlessly deteriorates the aperture ratio of the pixels. Next, the range within which the light-shielding layer is to be placed will be described in details.

The light-shielding required regions that are ought to be blocked by the light-shielding layer are the channel region 23a and the LDD region 23b where the photo-carrier is generated. However, there is the light entering around the ends of the light-shielding layer by diffraction, so that it is preferable to provide a larger light-shielding layer than the regions to be blocked. Transistors having various shapes of light-shielding layers were actually fabricated, and the difference in the off-currents in a case of irradiating light and a case of not irradiating light, i.e., the light leakage currents, were compared. As a result, it was found that the light leakage current was decreased when the light-shielding layer was protruded from the external shape same as the light-shielding required region and as the extrusion amount of the light-shielding layer was increased, and that the light leakage current became almost constant with a certain extrusion amount or more. From the result, it is found that at least 1.5 μm is required as the extrusion amount of the light-shielding layer from the light-shielding required region of the active layer 23, and it is more preferable to be 2.0 μm or more. Further, for decreasing the change in the light leakage current in a smaller region than the values of the extrusion amount, it is more preferable to set the film thickness of the underlying insulating layer 22 (FIG. 8) to be 400 nm or less.

Figure 15:
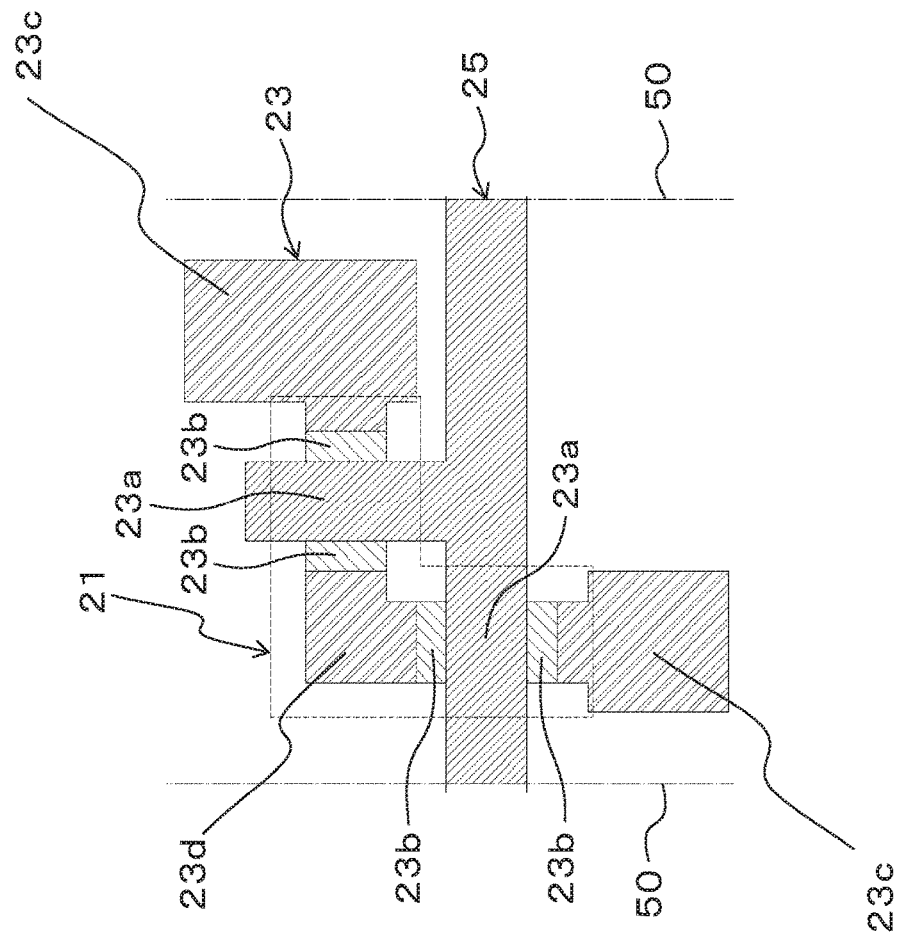
FIG. 15 is a plan view showing the position of the minimum light-shielding layer for suppressing the light leakage current according to the first exemplary embodiment.

FIG. 15 is a plan view showing the light-shielding layer 21 having 2.0 μm of extrusion amount from the light-shielding required region. A broken line shows the range where the light-shielding layer 21 is ought to be placed. In the design of the photomask, changes in the size caused in exposure and etching are taken into consideration according to the applied process. The layout of the light-shielding layer 21 shown in FIG. 15 is the minimum limit range based on the light-shielding performance. For the LDD regions 23b neighboring to the middle region 23d, employed is a policy to shield the entire middle region 23d. With the above, the condition of having 2.0 μm or more of extrusion amount of the light-shielding layer 21 can be satisfied. With the use of the light-shielding layer 21 in such shape, the light leakage current generated by direct irradiation of the backlight can be suppressed effectively.

At the beginning of the first exemplary embodiment, it is described that the threshold voltage fluctuation dVth depending on Vd is larger in the case of the transistor with the light-shielding layer than the case of the transistor without the light-shielding layer. If the Vd dependency can be suppressed, it becomes possible to acquire the transistor exhibiting the same stability as the case of having no light-shielding layer while suppressing the light leakage current by the light-shielding layer. To investigate a measure for achieving it, dVth of samples of dual gate transistors in which various shape light-shielding layers were provided were measured.

The inventors of the present invention closely examined various data for finding indicators for suppressing the Vd dependency from the results. As a result, the opposing area of the drain region and the light-shielding layer (Sd) was acquired in view of the dependency to the drain voltage Vd, the opposing area of the gate electrode and the light-shielding layer (Sg) was acquired in view of the fact that the response for the gate voltage Vg is the original characteristic, the ratio Sg/Sd of those was taken as the G/D ratio that was the indicator for expressing the characteristic of the light-shielding layer for corresponding to various shapes, and it was found that the dVth as the indicator of the drain voltage dependency exhibits a specific regularity for G/D ratio.

Figure 16:
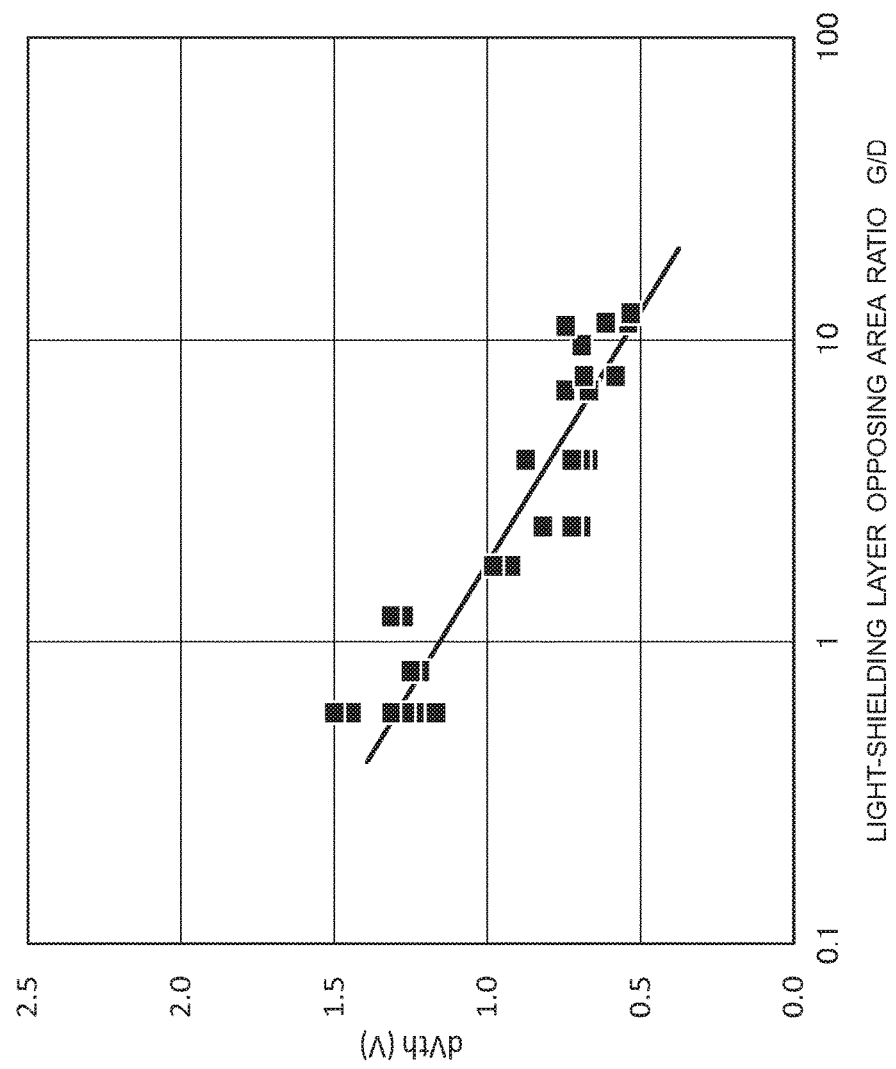
FIG. 16 is a graph showing a case (dual gate) of measuring the characteristic fluctuation dVth with respect to the light-shielding layer opposing area ratio (G/D) in the first exemplary embodiment.

FIG. 16 is a graph in which Vd dependency of Vth (change amount of the threshold voltage when Vd is changed in a range of Vd=−2 to −18 V: dVth) when the shape of the active layer and the shape of the light-shielding layer are changed in a dual gate transistor (L=4 μm, W=4 μm, length of LDD region=1.0 μm, PMOS, light-shielding layer: chromium 70 nm, underlying insulating layer: 400 nm) are plotted for the G/D ratio shown as the indicator.

Figure 17:
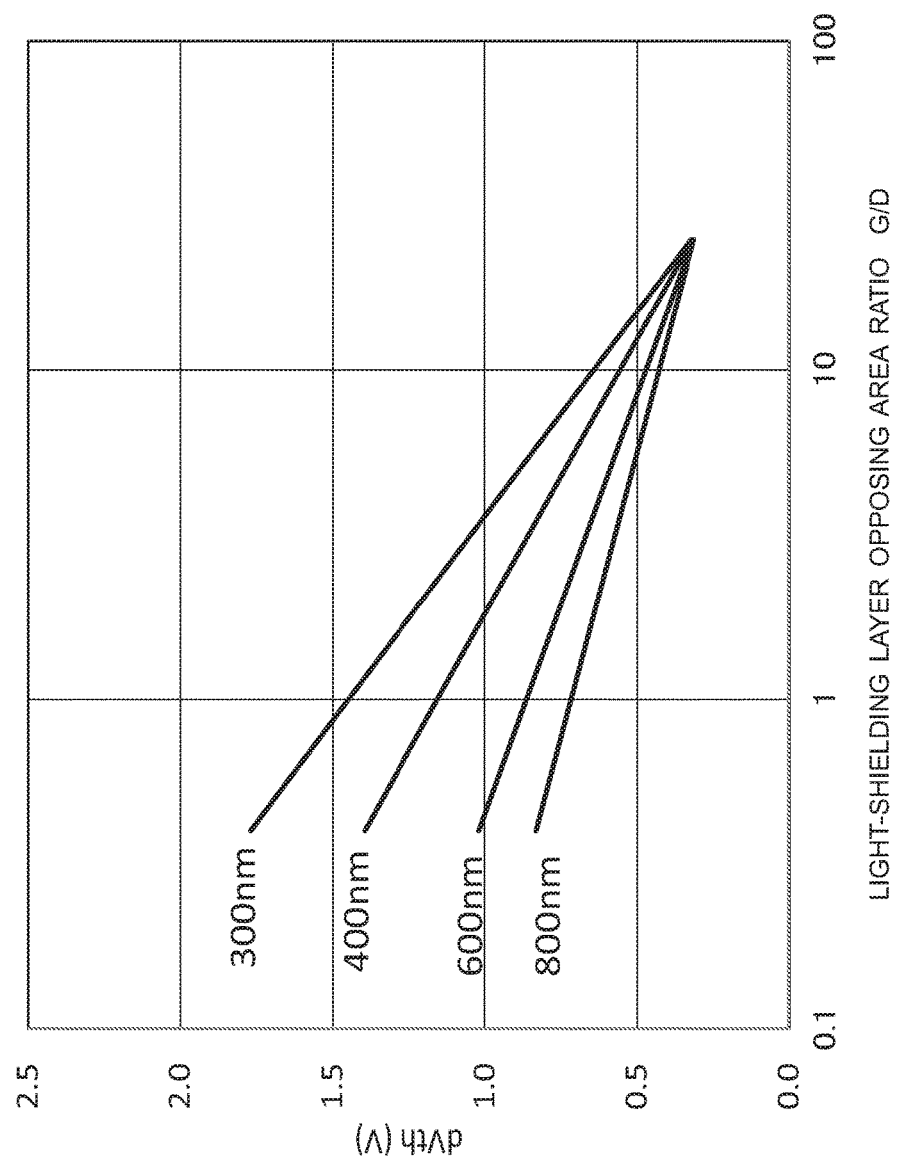
FIG. 17 is a graph showing a relation (dual gate) of the characteristic fluctuation dVth with respect to the light-shielding layer opposing area ratio (G/D) in the first exemplary embodiment.

Similarly, as the result of performing a regression analysis including the measurement results of the cases where the film thickness of the underlying insulating layer was set as 300, 600, and 800 nm, it was found that the relation thereof can be expressed by a following expression. FIG. 17 shows the plot by the regression equation.

$$dVth = \alpha \cdot \ln(Sg/Sd) + \beta$$

$$\alpha = -0.108/tul + 0.00929$$

$$\beta = 0.351/tul + 0.277 \quad \text{(Expression 1)}$$

dVth: Fluctuation width (V) of threshold voltage Vth in range of Vd=−2 V to −18 V Sg: Opposing area of light-shielding layer and gate layer ($\mu m^2$)

Sd: Opposing area of light-shielding layer and drain region ($\mu m^2$)

tul: Thickness of underlying insulating layer (μm)

Figure 18:
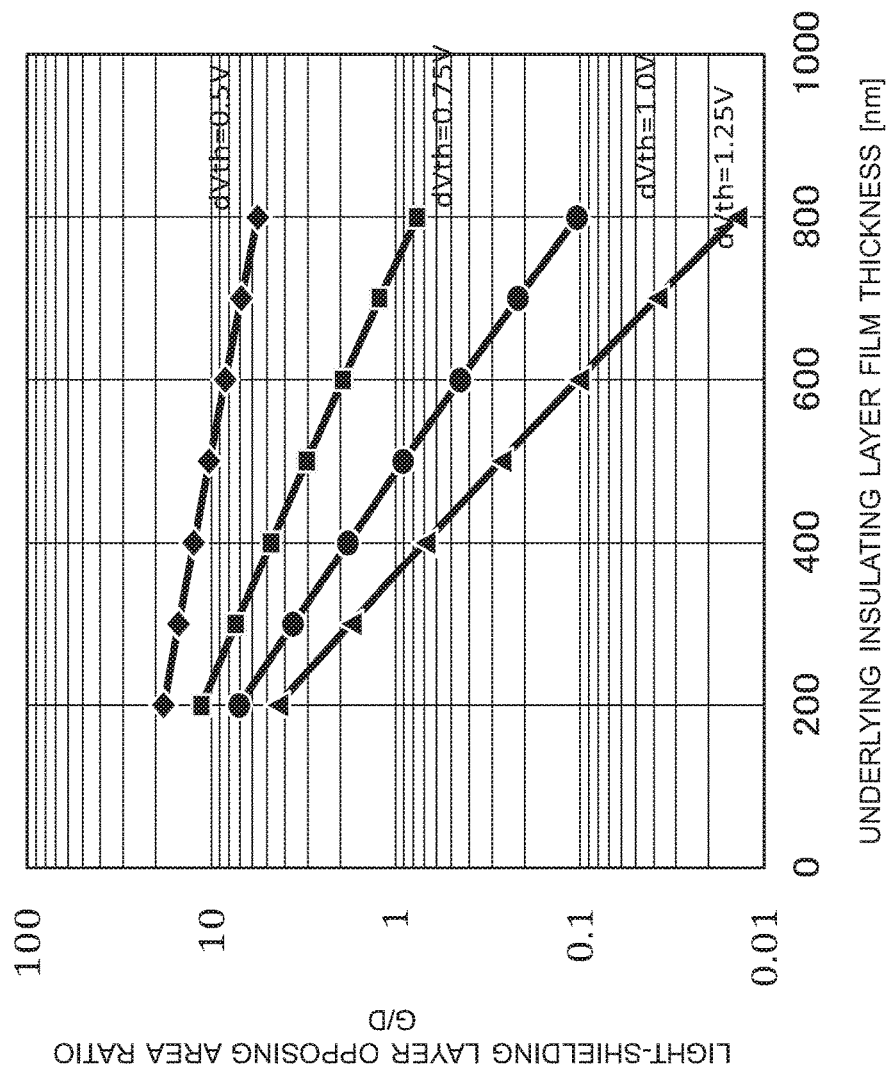
FIG. 18 is a graph showing a relation (dual gate) between the underlying film thickness and the G/D ratio for acquiring a constant dVth in the first exemplary embodiment.

With this single expression, the influence to the transistor characteristic from the film thickness of the underlying insulating layer (underlying film thickness) and the layout of the light-shielding layer can be written. Thus, as shown in FIG. 18, it is also possible to acquire the relation between the underlying film thickness and the G/D ratio when the target dVth is defined. For example, when the characteristic fluctuation dVth=0.75 V is to be achieved with the underlying insulating layer of 400 nm, it can be found that the G/D ratio of about 5 or more may be employed for the layout by reading the point at which the line of dVth=0.75 V intersects with the underlying film thickness of 400 nm in FIG. 18.

Next, the extent of suppression in dVth will be estimated with various types of layout of the light-shielding layer based on the shape in FIG. 15.

The overlapping area between the light-shielding layer 21 and one of the source-drain regions 23c is Sd=8 $\mu m^2$ in the layout of FIG. 15. Further, the overlapping area between the light-shielding layer 21 and the gate electrode 25 is Sg=32 $\mu m^2$. At this time, the indicator G/D acquired by the Sg/Sd ratio is 4.0.

As clear from FIG. 17, when G/D=4.0, dVth is about 0.8 V in a case where the film thickness of the underlying insulating layer is 400 nm while dVth is about 1.0 V in a case where the film thickness of the underlying insulating layer is 300 nm. In the meantime, dVth in the dual-gate transistor having no light-shielding layer is 0.28 V (FIG. 1B). Therefore, there are fluctuations of about three times in dVth of the dual-gate transistor with the light-shielding layer shown in FIG. 15 compared to that of dVth in the dual gate transistor with no light-shielding layer.

Figure 19:
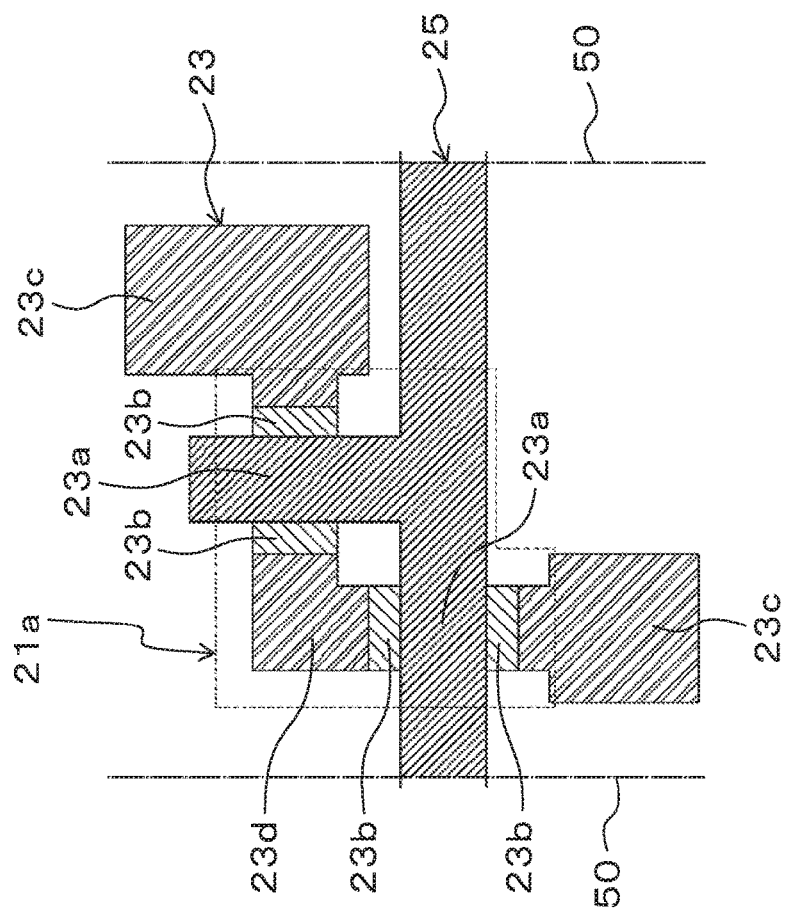
FIG. 19 is a plan view showing a design example (dual gate) of a light-shielding layer according to the first exemplary embodiment.

Next, a method for suppressing the characteristic fluctuation will be investigated. As shown in FIG. 19, the overlapping area of the light-shielding layer 21a and the gate electrode 25 was increased without influencing the aperture ratio while maintaining the minimum light-shielding range. It is not necessary to concern about shielding the light in the overlapping part of the light-shielding layer 21a and the gate electrode 25, so that it is set to extrude by 0.5 μm. In the meantime, the overlapping parts of the light-shielding layer 21a and the source-drain regions 23c on the data line side and the pixel side are not changed. In this state, when Sg is increased to 68 $\mu m^2$, the G/D ratio becomes 8.5. When the film thickness of the underlying insulating layer is set as 400 nm, dVth can be reduced to about 0.6 V as it is clear from FIG. 17. When the film thickness of the underlying insulating layer is set as 300 nm, dVth can be reduced to about 0.7 V as it is clear from FIG. 17.

Further, Sg is increased to the limit. In FIG. 19, the parts where the light-shielding layer 21a and the gate electrode 25 (including the gate line) can be overlapped are the part up to the borders of the sub-pixels shown with the border lines 50 (long and short dashed line) at the left and right ends and the projected end part of the gate electrode 25 of the transistor on the pixel side.

However, considering arbitrary image signals, inversion drive, and the like, the neighboring sub-pixel is in a different operation state from that of the target sub-pixel. To link the light-shielding layers in completely different operation state means to receive the influence of the state of the neighboring pixel. That is, it may be the cause for generating crosstalk in display. Thus, it is preferable that the light-shielding layer is separated in a unit of sub-pixel, and at least a minimum separation width that can be cut in the manufacture process is required.

Figure 20:
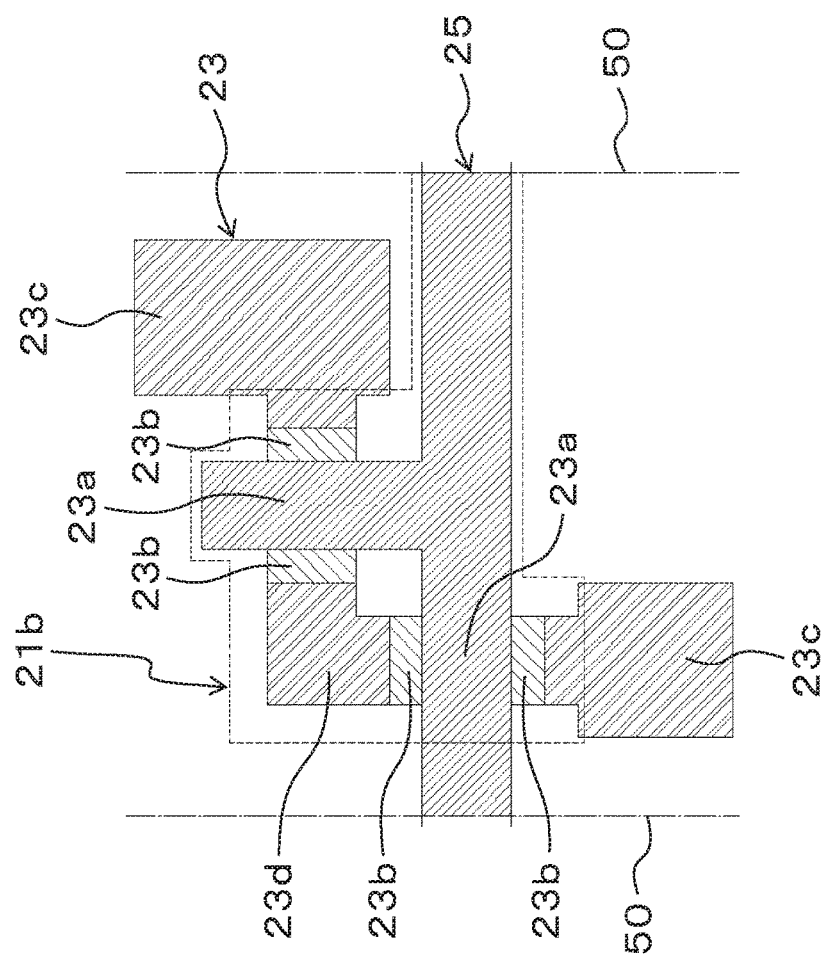
FIG. 20 is a plan view showing a design example (dual gate) in which a light-shielding layer considered to have substantially the upper limit of the G/D ratio in the first exemplary embodiment.

In the light-shielding layer 21b shown in FIG. 20, a total of 3.5 μm is provided as the separation width in which the minimum exposure resolution is set as 3 μm and the undercut is 0.5 μm. In this case, the separation region is provided on the left end of the gate line. However, the influence for dVth is the same regardless of where the separation region is provided. In the layout of FIG. 20, Sg is increased up to 110 $\mu m^2$, so that the G/D ratio becomes 13.8. At this time, when the film thickness of the underlying insulating layer is set as 400 nm, dVth becomes lower than 0.5 V as it is clear from FIG. 17. When the film thickness of the underlying insulating layer is set as 300 nm, dVth is about 0.5 V as it is clear from FIG. 17.

As described above, in the practical pixel layout, even when the film thickness of the underlying insulating layer is 300 nm or 400 nm, it can be found that the characteristic fluctuation depending on Vd can be suppressed to be twice or less compared to dVth=0.28 of the case with no light-shielding layer.

For designing the device such as the liquid crystal display, it is naturally necessary to concern the characteristic fluctuation depending on Vd. The characteristic fluctuation of the thin film transistor will be discussed comprehensively along with other fluctuation factors by taking the threshold voltage Vth as the indicator.

In order to write the potential corresponding to the image signal securely to the pixel and hold it, it is necessary to give a margin to the driving voltage of the pixel transistor by considering various threshold voltage fluctuations. However, as the main factors for the fluctuations of the threshold voltage, there are various factors other than variation in the manufacture steps and deterioration in the elements caused due to operations. It is necessary to set the driving voltage margin by taking all of those fluctuations into consideration. In the meantime, when the driving voltage margin is too large, the power consumption is increased. Therefore, it is required to set the margin properly in every use when the liquid crystal display is used.

For example, in a case of industrial use where a long-term use of ten years or more is expected, the driving voltage margin needs to be distributed to the change in the threshold voltage caused due to deterioration of the device. Thus, when the variation in the manufacture steps is excluded, the remaining margin is about 0.5 V. Therefore, the fluctuation in the threshold voltage by the potential of the light-shielding layer needs to fall within that margin. In the meantime, in a case where a long-time use is not expected such as a case of mobile apparatuses, the remaining margin can be set as about 2 V so that the allowable range of the fluctuation in the threshold voltage caused by the potential of the light-shielding layer is expanded. As a case where the intermediate use period is expected, it is reasonable to take the remaining margin excluding the variation in the manufacture steps and deterioration in the device due to operations as about 1 V. Therefore, the fluctuation in the threshold voltage by the potential of the light-shielding layer needs to fall within that margin.

In the liquid crystal display that does not require the light-shielding layer, the characteristic change dVth caused by the fluctuation of the drain voltage is 0.28 V which can be sufficiently absorbed within the margin of 1 V. In the device provided with the light-shielding layer for dealing with the high-luminance backlight, it is preferable to design the characteristic fluctuation dVth depending on Vd to be 0.75 V so as to fall within the margin of 1 V.

The reason thereof is that the fluctuation cannot absorbed by the margin when dVth exceeds 1 V. Further, even when dVth is not over 1 V but close to that, the reassuring in terms of the design cannot be assured. Thus, it is required to employ a design in which dVth does not exceed 1 V obviously. Further, as described above, considering the pixels of the liquid crystal display, it is practically difficult to set dVth to be smaller than 0.5 V. Considering such circumstances, it is rational to take a round numerical value that is in the intermediate point thereof as a guideline of design.

From Expression 1 described above, the G/D ratio when dVth=0.75 is 4.7 in a case where the film thickness of the underlying insulating layer is 400 nm and 7.3 in a case where the film thickness of the underlying insulating layer is 300 nm. Incidentally, in a case where the film thickness of the underlying insulating layer is 300 nm and the G/D ratio is 4.7, dVth=0.9 V which is slightly lower than 1 V.

Here, the G/D ratio that is the ratio of the opposing area acquired above will be expressed with a ratio of capacitance. The capacitance ratio Cg/Cd is acquired by defining that the static capacitance of the overlapping part of the drain region and the light-shielding layer as Cd and the static capacitance of the gate electrode and the light-shielding layer as Cg. For calculating those static capacitances, the materials and the film thickness constituting the device were set as those described in the first exemplary embodiment and a simple parallel flat plate model was used in which the relative dielectric constant is 3.9 for silicon oxide film and 7.5 for silicon nitride film.

Under the above-described condition, the capacitance ratio Cg/Cd when dVth=0.75 V is 3.6 in a case where the film thickness of the underlying insulating layer is 400 nm and 5.1 in a case where the film thickness of the underlying insulating layer is 300 nm. Incidentally, the capacitance ratio Cg/Cd when dVth=0.9 V is 3.3 in a case where the film thickness of the underlying insulating layer is 300 nm.

As described, even when the same dVth is set, the value of the capacitance ratio Cg/Cd varies depending on the film thickness of the underlying insulating layer. The reason is that the techniques of Patent Documents 3, 4, and 5 simply acquire the condition with which the potential of the light-shielding layer is determined to a fixed value, while the model of the first exemplary embodiment further includes the fact that the potential of the light-shielding layer affects the active layer and influences the characteristic of the transistor.

The way of thinking regarding the design for suppressing the characteristic fluctuation when the light-shielding layer for blocking the light irradiated from the high-luminance backlight is provided has been described heretofore by referring to the case of the dual-gate thin film transistor used for the pixel of the liquid crystal display. When those are combined, the guideline of the geometrical layout becomes clear.

In view of the light-shielding characteristic, at least 70 nm is required for the film thickness of the light-shielding layer. It is preferably 100 nm or more, and it is 140 nm for more certainty. In view of the process adaptability, the film thickness of the underlying insulating layer is preferable to fall within a range of at least 200 to 500 nm in total. Further, when considering the process stability and the light-shielding characteristic, it is preferable to fall within a range of 300 nm to 400 nm, both inclusive, in total. In view of the light-shielding characteristic, at least 1.5 µm is required for the extrusion amount of the light-shielding layer from the light-shielding required region of the active layer. It is preferably 2.0 µm or more. Further, it is preferable to set the Sg/Sd ratio (G/D ratio) as 4.7 or more, and still more preferable to set it as 7.3 or more.

Thereby, it is possible to suppress the characteristic fluctuation of the thin film transistor caused due to the change in the drain voltage while suppressing the light leakage current. Further, by constituting the display device such as the liquid crystal display by using the thin film transistor, it is possible to expect highly reliable and stable operations with excellent display qualities such as high contrast, low crosstalk, and low flicker.

The manufacture process of the TFT array substrate described above is merely an example, and there is no intention of setting limits to the first exemplary embodiment for those sections with no special remarks. The effects of the first exemplary embodiment can be achieved with other methods, conditions, and materials. Further, while the process after the manufacture of the TFT array substrate is described in a greatly simplified manner, any processes used in general can be employed to the first exemplary embodiment.

As an exemplary advantage according to the invention, the present invention makes it possible to suppress bad influences of the drain voltage imposed upon the transistor characteristic via the light-shielding layer through setting the film thickness of the insulating layer to fall within a proper range and by setting the ratio between the area where the light-shielding layer overlaps with the drain region and the area where the light-shielding layer overlaps with the gate electrode to fall within a proper range.

Second Exemplary Embodiment

In the first exemplary embodiment, the method regarding the layout of the light-shielding layer for suppressing the characteristic fluctuation in the dual-gate thin film transistor is described. The result acquired by applying the same idea to a single-gate thin film transistor will be described as a second exemplary embodiment.

Figure 21:
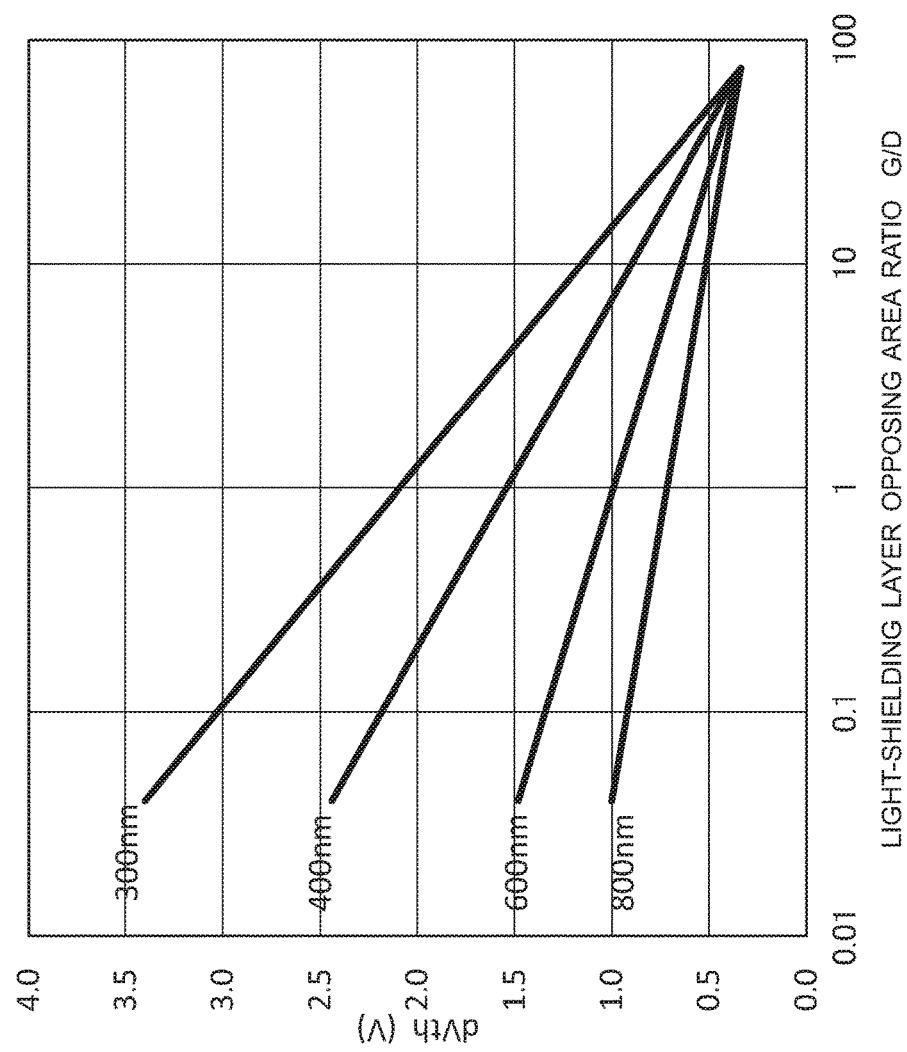
FIG. 21 is a graph showing a relation (single gate) of the characteristic fluctuation dVth with respect to the light-shielding layer opposing area ratio (G/D) in a second exemplary embodiment.

With the single-gate transistor, the change width dVth of the threshold voltage Vth of the transistor is determined by the ratio G/D=Sg/Sd provided that Sg is the overlapping area of the light-shielding layer and the gate layer and Sd is the overlapping area of the light-shielding layer and the drain layer. The characteristic fluctuation was measured by changing the shape of the light-shielding layer in the transistor of the basic layout as shown in FIG. 1A, and a regression analysis was performed on the acquired data. FIG. 21 shows the result. A regression equation can be written as follows.

$$dVth = \alpha \cdot \ln(Sg/Sd) + \beta$$

$$\alpha = -0.153/tul + 0.103$$

$$\beta = 0.659/tul - 0.107 \quad \text{(Expression 2)}$$

dVth: Fluctuation width (V) of threshold voltage Vth in range of Vd=−2 V to −18 V
Sg: Opposing area of light-shielding layer and gate layer ($\mu m^2$)
Sd: Opposing area of light-shielding layer and drain region ($\mu m^2$)
tul: Thickness of underlying insulating layer ($\mu m$)

Figure 22:
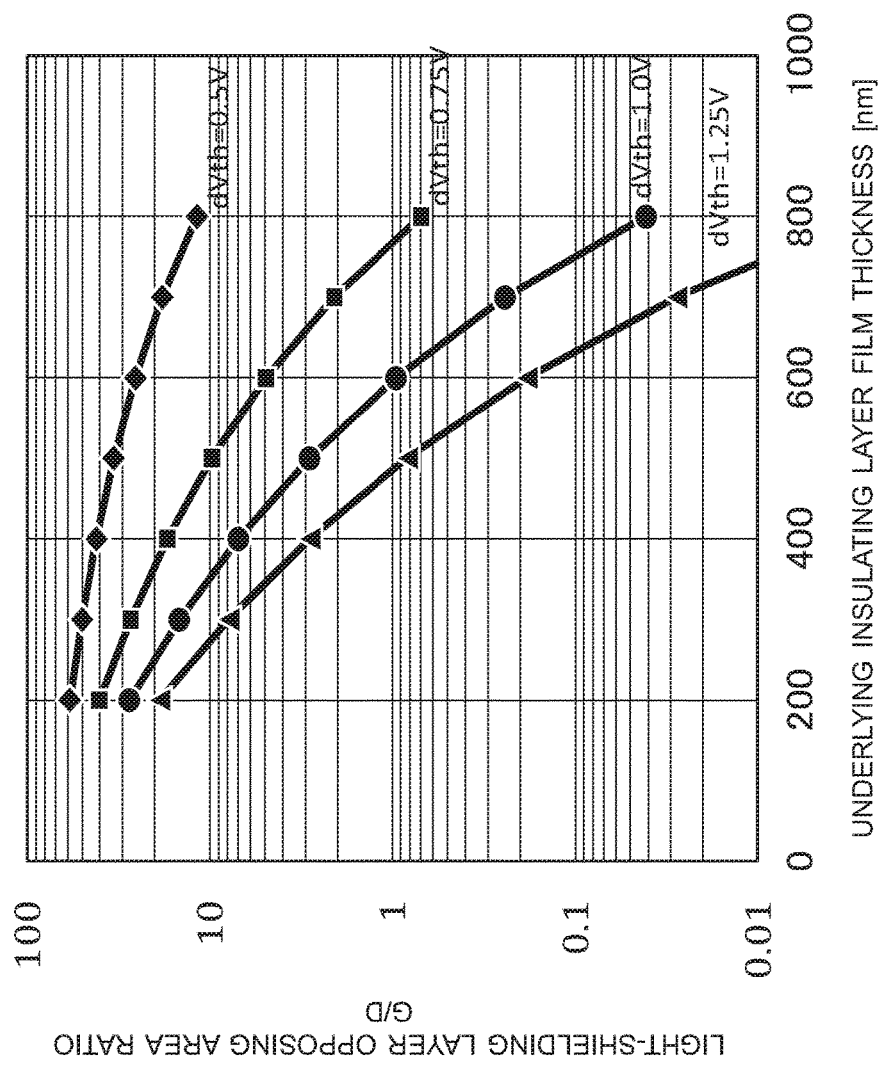
FIG. 22 is a graph showing a relation (dual gate) between the underlying film thickness and the G/D ratio for acquiring a constant dVth in the second exemplary embodiment.

The form of Expression 2 is the same as the case of the dual-gate type, while the coefficient is different from that of the dual-gate type. FIG. 22 is a graph where axes are taken in a different manner, which shows the relation between the film thickness of the underlying insulating layer and the G/D ratio when dVth is defined. This makes it possible to estimate the characteristic fluctuation when a floating light-shielding layer is placed in a single-gate transistor.

In a case where the active layer is formed with amorphous silicon, the thin film transistor is mainly used as a pixel transistor or a protection element. However, in a case where the active layer is formed with polycrystalline silicon, the thin film transistor can constitute a part of circuit such as a multiplexer which branches outputs of a gate driver and a data driver of IC chip. In a case where not only the pixel transistor but also the transistor constituting the peripheral circuit is exposed to the backlight, the influence of the characteristic can be suppressed to a necessary range by adjusting the layout of the light-shielding layer based on the above-described relation.

In FIG. 22, in order to achieve the characteristic fluctuation width dVth≤0.75 in a case where the film thickness of the underlying insulating layer is 400 nm, for example, it can be found that a layout with which the G/D ratio exceeds slightly less than 20 may be employed. In a case of the single-gate type, dVth in the transistor having no light-shielding layer is 0.3 V.

FIG. 23 is a case of a transistor of L/W=4/4 $\mu m$ and both side LDD=1.0 $\mu m$, which is in a layout where the extrusion amount of the light-shielding layer 21c for the light-shielding required region of the active layer is 2.0 $\mu m$ and the extrusion amount of the light-shielding layer 21c for the light-shielding required region of the gate electrode 25 is 0.5 $\mu m$. The line width of the source-drain regions 23c on both ends of the active layer 23 is formed thick for being connected to the drain electrode layer via a contact hole. Further, the light-shielding layer 21c is an isolated pattern separated between the neighboring sub-pixels.

The opposing area when the light-shielding layer 21c is placed to the range of the broken line is 8 $\mu m^2$ for the drain region and 136 $\mu m^2$ for the gate layer, and G/D is 17.0. As clear from FIG. 21, provided that the film thickness of the underlying insulating layer is 400 nm, the characteristic fluctuation of the transistor can be estimated as dVth≈0.75 V.

As shown in FIG. 23, by adequately utilizing a wiring routing part that uses the gate layer, the overlapping part with the gate layer can be secured. Thus, it is possible to suppress the light leakage current by blocking the transistor from the backlight and to suppress the characteristic fluctuation as well.

Similarly, as clear from FIG. 21, provided that the film thickness of the underlying insulating layer is 300 nm, the characteristic fluctuation of the transistor can be estimated as dVth=0.75 V when the G/D ratio is 27. If such G/D ratio cannot be secured on the layout by any means, the G/D ratio can be 10 in a case where the film thickness of the underlying insulating layer is 400 nm and can be 18.5 in a case where the film thickness of the underlying insulating layer is 300 nm by making concession to dVth=0.9 V which is just under the operation margin. The preferable film thickness range of the underlying insulating layer is the same as that of the first exemplary embodiment.

Here, the G/D ratio that is the ratio of the opposing area acquired above is expressed with a ratio of capacitance. The calculation method is the same as that of the first exemplary embodiment. Under the above-described condition, the capacitance ratio Cg/Cd when dVth=0.75 V is 12.9 in a case where the film thickness of the underlying insulating layer is 400 nm and 18.8 when the film thickness of the underlying insulating layer is 300 nm. Further, the capacitance ratio Cg/Cd when dVth=0.9 V is 7.6 in a case where the film thickness of the underlying insulating layer is 400 nm and 12.9 when the film thickness of the underlying insulating layer is 300 nm.

Other structures, operations, and effects of the second exemplary embodiment are the same as those of the first exemplary embodiment.

Third Exemplary Embodiment

Figure 24A:
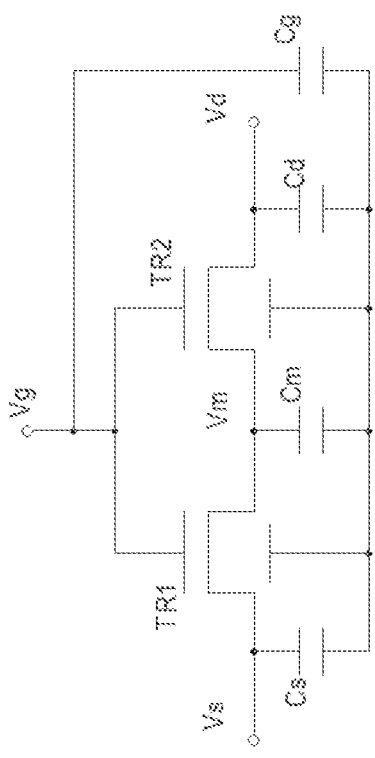
FIG. 24A is an equivalent circuit diagram of a case where a common light-shielding layer is provided in a dual gate transistor.

It has been mentioned that there are changes in the threshold voltage Vth depending on Vd as the characteristic fluctuation caused by the floating light-shield layer. Now, a model of a dual-gate transistor in which a drain voltage Vd is applied by taking a source voltage Vs as the reference will be discussed. FIG. 24A is an equivalent circuit when a common light-shielding layer is provided in a dual-gate transistor. Vg, Vd, Vs, and Vm show the potentials at the point shown in the drawing.

The models of the first and second exemplary embodiments are to suppress the influence of Vd to a prescribed range by adjusting the ratio of the opposing areas based on the model, in which the potential of the light-shielding layer is determined with a balance between the influence of Vd imposed upon the potential of the light-shielding layer through the opposing face Cd between the drain region and the light-shielding layer and the influence of the gate voltage Vg imposed upon the potential of the light-shielding layer through the opposing face Cg between the gate layer and the light-shielding layer, and affects the active layer (channel region and LDD region). The third exemplary embodiment employs a method which reduces the influence itself of Vd in a multi-gate thin film transistor including a dual-gate transistors.

In a dual-gate transistor, the drain voltage Vd−Vs applied entirely is divided nearly to half for each of two transistors TR1 and TR2. That is, a following expression applies.

$$Vm-Vs \approx Vd-Vm \approx \tfrac{1}{2}\cdot(Vd-Vs)$$

In a case where a common light-shielding layer is provided for the two transistors as shown in FIG. 24A, the drain voltage Vd−Vs applied to the entire dual gate transistor influences TR1 and TR2 via the light-shielding layer.

Figure 24B:
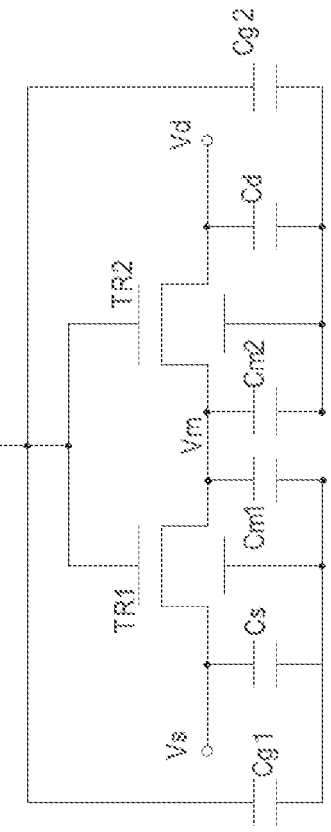
FIG. 24B is an equivalent circuit diagram of a case where separate light-shielding layers are provided in a dual gate transistor according to the third exemplary embodiment.

In the meantime, FIG. 24B is an equivalent circuit when an individual light-shielding layer is provided in each transistor of a dual-gate transistor. In a case where the light-shielding layer is divided for TR1 and TR2 as shown in FIG. 24B, the drain voltages influencing the light-shielding layers is Vm−Vs in TR1 and Vd−Vm in TR2, respectively, so that the voltage value is decreased nearly to half. For example, when paying attention only to TR1, the potential difference in the structure of FIG. 24A which receives the influence of the potential difference of up to Vd−Vm which exceeds the drain voltage of TR1 itself is almost twice of that of the structure of FIG. 24B which receives the influence of the drain voltage Vm−Vs of the TR1 itself. It is evident that the magnitudes of the influences are different.

FIG. 25A to FIG. 25C are examples of plan shapes of a dual-gate transistor in which the active layer 23 is bent in a U-letter shape. The dual-gate transistor shown in FIG. 25A is a layout in which the equivalent circuit corresponds to FIG. 24A, and G/D is 0.58. The light-shielding layer 21d is placed to have a relatively large overlapping part with the drain regions 23c.

Figure 26:
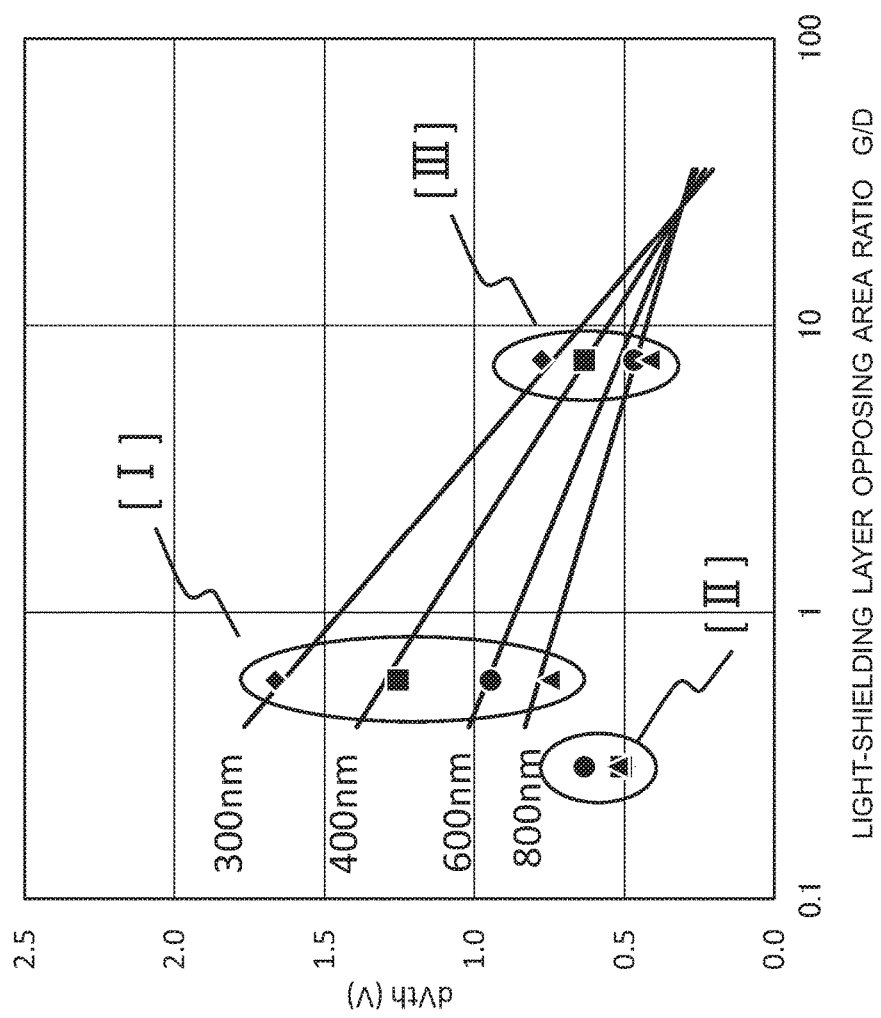
FIG. 26 is a graph showing the characteristic fluctuation suppressing effect of the dual-gate transistor with the divided separate light-shielding layers according to the third exemplary embodiment in a relation of the G/D ratio and dVth.

As a comparison target, the dual-gate transistor shown in FIG. 25B is an example in which the light-shielding layer is divided into light-shielding layers 21e, 21f in the middle part of the dual gate to provide each of the light-shielding layers 21e, 21f to the individual transistors, which is a layout in which the equivalent circuit corresponds to FIG. 24B, and G/D is 0.29. The overlapping area between the light-shielding layers 21e, 21f and the drain region 23c and the overlapping area between the light-shielding layers 21e, 21f and the gate electrode 25 (including the gate line) are same as the case of FIG. 25A. However, the light-shielding layer is divided into the light-shielding layers 21e, 21f, so that the overlapping area between the light-shielding layers 21e, 21f and the gate electrode 25 is taken as the overlapping area of one side for calculation. FIG. 26 shows comparisons of those characteristics.

FIG. 26 shows the relation between the values of the G/D ratio and dVth in the cases of FIG. 25A to FIG. 25C. The layout of FIG. 25A corresponds to the position of [I] in FIG. 26, and the layout of FIG. 25B corresponds to the position of [II] of FIG. 26. As shown in [II] of FIG. 26, the characteristic change depending on Vd can be greatly suppressed by dividing the light-shielding layers for each of the transistors in the dual-gate structure. [III] of FIG. 26 is the data of a case where G/D is set as 7.6 by decreasing the overlapping part of the light-shielding layer 21g and the drain region 23c and increasing the overlapping part of the light-shielding layer 21g and the gate electrode 25 as shown in FIG. 25C. In FIG. 26, it can be seen that [II] and [III] show the almost equivalent Vd dependency.

As described, in the case of the multi-gate TFT such as the dual-gate type, the characteristic fluctuation of the transistors depending on the drain voltage can be greatly suppressed by dividing the light-shielding layers to be placed for each of the transistors. This is the idea applied not only to the dual-gate type but also to whole multi-gate transistors such as triple-gate and quadruple-gate types in which three and four transistors are connected in series. In a case of having four or more transistors, it is not essential to divide the light-shielding layer for each one of the transistors. For example, in a case of having four transistors connected in series, the same effects can be acquired by dividing the light-shielding layer in two transistors each.

Further, regarding the plan layout of a plurality of transistors, FIG. 25B shows a U-letter type layout in which the active layer 23 is bent at 180 degrees. However, it is evident that not only this layout but also an L-letter type layout in which the active layer 23 is bent at 90 degrees as shown in FIG. 15 and an I-letter type layout in which the active layer is placed on a straight line can provide the same effects.

However, for dividing the light-shielding layer as in the third exemplary embodiment, there is a restriction in the minimum processing size in the process executed for dividing the light-shielding layer. Thus, the transistors occupying area as a whole may become too large in some cases. When the transistors are used for the switches of the pixels, the increase in the area occupied by the transistors may lead to decrease in the aperture ratio. Thus, whether or to divide the light-shielding layer may be decided along with selection of the shape of the active layer based on a comprehensive consideration.

Other structures, operations, and effect of the third exemplary embodiment are the same as those of the first and second exemplary embodiments.

Fourth Exemplary Embodiment

Figure 27:
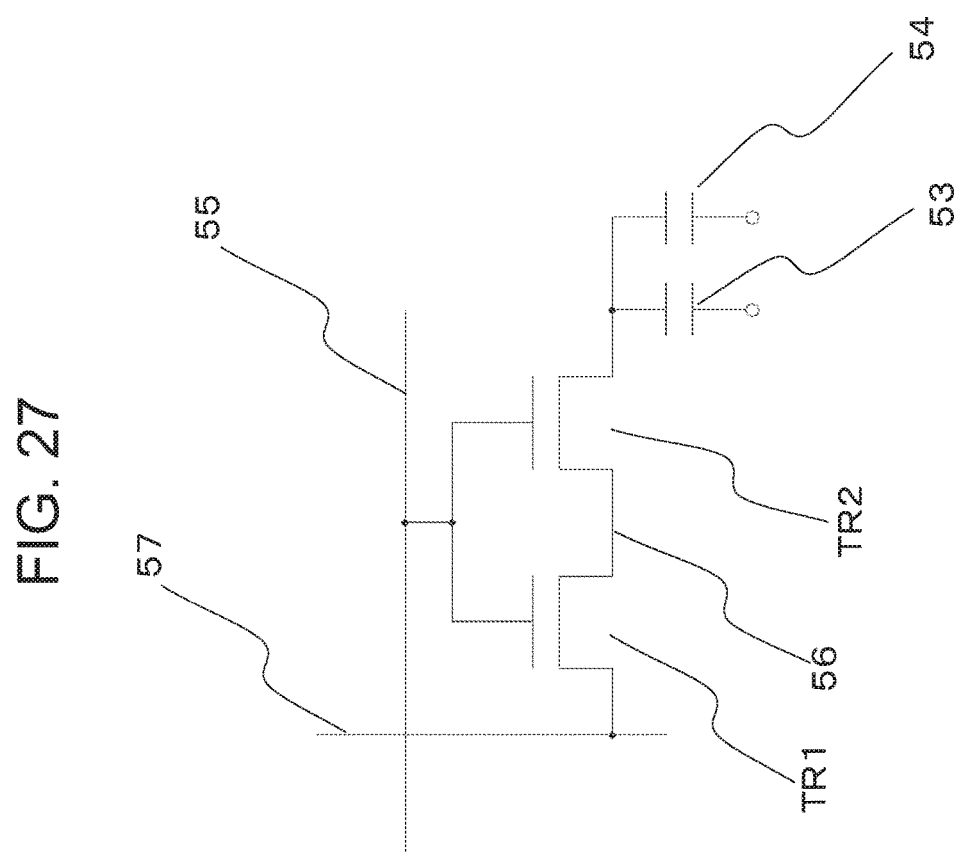
FIG. 27 is an equivalent circuit diagram of a pixel using the dual gate transistor.

FIG. 27 is an equivalent circuit of one pixel of an active-matrix type liquid crystal display using a dual-gate transistor. Actions thereof will be described briefly. Two transistors TR1, TR2 are turned on by a scanning signal applied to a gate line 55 to charge the potential corresponding to an image signal of a data line 57 to a pixel 54 and an auxiliary capacitance 53, then the scanning signal of the gate line 55 is turned to an off level to turn off TR1, TR2, and the electric charge charged to the pixel 54 and the auxiliary capacitance 53 is held. This action is repeated. While the light-shielding layer is not illustrated in FIG. 27, the light-shielding layer according to the fourth exemplary embodiment is illustrated in FIG. 28 to FIG. 30 to be described later.

In the third exemplary embodiment, described is the case where the light-shielding layer of the thin film transistor having the light-shielding layer is divided for each of the multi-gate transistors. In the meantime, the fourth exemplary embodiment employs a method which suppresses the characteristic fluctuation by dividing the light-shielding layer and focusing on one of the transistors.

Looking at the potential of each electrode of the transistor in a holding state, the pixel side is the potential charged to the pixel 54 and the auxiliary capacitance 53. On the data line 57 side, the image signal to the pixel driven by another gate line is supplied. Thus, it changes moment by moment. Accordingly, the potential difference between the both ends of the multi-gate transistor changes moment by moment. The potential of an intermediate region 56 is an almost intermediate potential of the pixel 54 side and the data line 57 side. Thus, there is no large difference in the voltages between the source-drains in each of TR1 and TR2.

When the overlapping area between the light-shielding layer and the source-drain region is set as the same and the light-shielding layer is divided in TR1 and TR2, the influences of the drain voltage upon the characteristic fluctuation in each of TR1 and TR2 are almost the same. The extent of the characteristic fluctuation depends on the overlapping areas between each of the light-shielding layers and the gate electrode according to the model based on the G/D ratio described above. That is, the characteristic fluctuation caused by the drain voltage can be suppressed to be smaller with the transistor having a larger overlapping part between the light-shielding layer and the gate electrode.

In order to hold the electric charge written in the pixel, first, it is essential to stop or suppress flow-out of the electric charge in TR2. FIG. 28 is a chart showing the positional relation of the light-shielding layers 21h, 21i, the active layer 23, and the gate electrode 25 of the pixel transistor of the liquid crystal display. The light-shielding layers 21h and 21i are divided, the G/D ratio is 2 on the data line side TR1 and 12.7 on the pixel side TR2 where the G/D ratio on the pixel side is set to be larger. By setting the G/D ratio of TR2 to be larger, the characteristic fluctuation of the transistor on the TR2 side can be suppressed still smaller for the fluctuation of the voltage between the source and drain.

FIG. 29 shows an example where the active layer 23 is placed in a U-letter shape. Employed herein is also the layout in which the G/D ratio becomes larger in TR2 on the pixel side. Through taking a large overlapping area between the light-shielding layers 21j, 21k and the gate electrode 25 in TR2 on the pixel side within such limited range, a more excellent characteristic can be achieved for holding the written electric charge. Thus, it is expected improve the display quality.

FIG. 30 shows an example where the active layer 23 is placed on a straight-line form in an I-letter shape. Employed herein is the layout in which the G/D ratio becomes larger in TR2 on the pixel side. Through taking a large overlapping area between the light-shielding layers 21l, 21m and the gate electrode 25 in TR2 on the pixel side as described, the characteristic fluctuation in TR2 on the pixel side is stabilized preferentially.

This can be expressed as a following numerical expression, provided that the opposing area between the light-shielding layer and the drain region in TR1 on the data line side is Sd1, the opposing area between the light-shielding layer and the gate electrode is Sg1, and also index 1 is changed to 2 in TR2 on the pixel side to be Sd2, Sg2, respectively.

$$(Sg1/Sd1) < (Sg2/Sd2)$$

Here, the relation in the values of the G/D ratio in TR1 and TR2 is expressed in the relation of the capacitance ratio Cg/Cd used in the first and second exemplary embodiments. By using the same naming scheme used for the opposing areas, the static capacitance of the light-shielding layer and the drain region in TR1 on the data line side is defined as Cd1, and the static capacitance of the light-shielding layer and the gate electrode is defined as Cg1. In TR2 on the pixel side, the index 1 is changed to 2 to define those as Cd2 and Cg2, respectively. With this, the relation between Cg1/Cd1 and Cg2/Cd2 will be investigated. For TR1 and TR2, the materials for constituting the films, the film thickness, the positions of the drain region, and positions of the gate line are the same. Thus, the opposing area is the only factor for determining the difference in the static capacitance. Therefore, it is not difficult to understand that Cg1/Cd1=Cg2/Cd2 is satisfied when Sg1/Sd1=Sg2/Sd2.

Now, the opposing area is the only factor for determining the difference in the static capacitance. The opposing area and the static capacitance are in a proportional relation, and the proportional coefficient is positive. Thus, when the opposing area is changed from this state to Sg1/Sd1<Sg2/Sd2, the relation of the capacitance ratios becomes Cg1/Cd1<Cg2/Cd2. Therefore, the layout condition of the fourth exemplary embodiment can be expressed as Cg1/Cd1<Cg2/Cd2 by using the capacitance ratio.

While the method of setting the G/D ratio on the pixel side to be larger when dividing the light-shielding layer is described by referring to the case of the dual-gate transistor herein, the same effect can be acquired with the general multi-gate transistors as a whole by setting the G/D ratio of the outer-side transistor closest to the pixel to be larger.

Other structures, operations, and effect of the fourth exemplary embodiment are the same as those of the first to third exemplary embodiments.

Supplementation of Exemplary Embodiments

In a thin film transistor of a multi-gate structure including a dual-gate type, each of the transistors constituting the multiple gates is referred to as "individual transistor". That is, a set of a channel region as an intersection part between a gate electrode and an active layer and LDD regions on both sides thereof is the "individual transistor", and it can be expressed that a plurality of the "individual transistors" are lined in series in the multi-gate structure.

Further, in the third exemplary embodiment, it can be expressed that the light-shielding layer of the "individual transistor" is divided and that at least one of the "individual transistors" overlaps with the light-shielding layer. Furthermore, in the fourth exemplary embodiment, it can be expressed in other words that a plurality of the "individual transistors" are lined in series in the active layer and the relation between the area ratio and the capacitance ratio described above applies for the light-shielding layers provided to the "individual transistors" on both ends of the line.

While the exemplary embodiments are described by referring to the case of the coplanar-type thin film transistor, the present invention can also be applied in the same manner to a normal staggered type thin film transistors and inverted staggered type thin film transistors.

While the present invention has been described above by referring to the structures and operations of each of the exemplary embodiments, the present invention is not limited only to each of the exemplary embodiments described above. It is to be noted that the present invention includes various changes and modifications which can occur to those skilled in the art without departing from the scope of the present invention. Further, the present invention includes the structures acquired by mutually and properly combining a part of or a whole part of the structures of each of the above-described exemplary embodiments.

While a part of or a whole part of the above-described embodiments can be summarized as following Supplementary Notes, the present invention is not limited only to the following structures.

(Supplementary Note 1)

A thin film transistor which includes:

a channel region, an LDD region, and a drain region formed with a polycrystalline silicon active layer;

gate electrodes provided at least in the channel region via a gate insulating film; and an electrically floating light-shielding layer which overlaps at least with the channel region and the LDD region via an insulating layer, wherein:

the thin film transistor is of a dual-gate structure;

film thickness of the insulating layer is equal to or more than 200 nm and equal to or less than 500 nm; and film thickness of the insulating layer is and Sg/Sd is 4.7 or more, provided that an area where the light-shielding layer overlaps with the drain region is Sd and an area where the light-shielding layer overlaps with the gate electrodes is Sg.

(Supplementary Note 2)

A thin film transistor which includes:

a channel region, an LDD region, and a drain region formed with a polycrystalline silicon active layer;

a gate electrode provided at least in the channel region via a gate insulating film; and an electrically floating light-shielding layer which overlaps at least with the channel region and the LDD region via an insulating layer, wherein:

the thin film transistor is of a single-gate structure;

film thickness of the insulating layer is equal to or more than 200 nm and equal to or less than 500 nm; and Sg/Sd is 17 or more, provided that an area where the light-shielding layer overlaps with the drain region is Sd and an area where the light-shielding layer overlaps with the gate electrode is Sg.

(Supplementary Note 3)

A thin film transistor which includes:

a channel region, an LDD region, and a drain region formed with a polycrystalline silicon active layer;

gate electrodes provided at least in the channel region via a gate insulating film; and an electrically floating light-shielding layer which overlaps at least with the channel region and the LDD region via an insulating layer, wherein:

the thin film transistor is of a multi-gate structure; and the light-shielding layer is divided into a plurality of light-shielding layers which are in an electrically floating state from each other.

(Supplementary Note 4)

The thin film transistor as depicted in Supplementary Note 3, wherein regarding one of and another one of the light-shielding layers corresponding to an outermost side of the polycrystalline silicon active layer out of the plurality of light-shielding layers, Sg/Sd of the one light-shielding layer is larger than Sg/Sd of the another light-shielding layer, provided that an area where the light-shielding layer overlaps with the drain region is Sd and an area where the light-shielding layer overlaps with the gate electrode is Sg.

(Supplementary Note 5)

The thin film transistor as depicted in Supplementary Note 3, wherein regarding one of and another one of the light-shielding layers corresponding to an outermost side of the polycrystalline silicon active layer out of the plurality of light-shielding layers, Cg/Cd of the one light-shielding layer is larger than Cg/Cd of the another light-shielding layer, provided that static capacitance of a part where the light-shielding layer overlaps with the drain region is Cd and static capacitance of a part where the light-shielding layer overlaps with the gate electrode is Cg.

(Supplementary Note 6)

A display device which includes the thin film transistor as depicted in Supplementary Note 1 as a pixel transistor.

(Supplementary Note 7)

A display device which includes the thin film transistor as depicted in Supplementary Note 2 as a pixel transistor or as a pixel transistor and a transistor of a peripheral circuit.

(Supplementary Note 8)

A display device which includes the thin film transistor as depicted in Supplementary Note 3 as a pixel transistor.

(Supplementary Note 9)

A display device which includes the thin film transistor as depicted in Supplementary Note 4 as a pixel transistor.

(Supplementary Note 10)

A display device which includes the thin film transistor as depicted in Supplementary Note 5 as a pixel transistor.

(Supplementary Note 11)

The display device as depicted in any one of Supplementary Notes 6 to 10, wherein the light-shielding layer is divided between neighboring pixels.

(Supplementary Note 12)

The display device as depicted in Supplementary Note 9, wherein the one light-shielding layer is located on a side closest to a pixel in the polycrystalline silicon active layer.

(Supplementary Note 13)

The display device as depicted in Supplementary Note 10, wherein the one light-shielding layer is located on a side closest to a pixel in the polycrystalline silicon active layer.

What is claimed is:

1. A thin film pixel transistor having a dual-gate structure, comprising:

a channel region, a LDD region, and a drain region formed with a polycrystalline silicon active layer, said active layer having a uniform thickness in the channel region and the LDD region, and having a protruded part of a corner of a step that is thinner than the channel region caused by surface tension, the step being formed by an electrically floating light-shielding layer; and gate electrodes provided at least in the channel region via a gate insulating film, the electrically floating light-shielding layer overlapping at least the channel region and the LDD region via an insulating layer, wherein a border is provided between the channel region and the LDD region, wherein a film thickness of the insulating layer is equal to or more than 200 nm and equal to or less than 500 nm, the channel region and the LDD region including concave portions along edges of the electrically floating light-shielding layer, and the border and the step are parallel with each other in plan view, wherein the dual-gate structure of the thin film transistor is constituted by a first transistor and a second transistor, the electrically floating light-shielding layer being electrically separated for each one of the first and second transistors, wherein, for the first and second transistors, an opposing area in plan view of the drain region and the electrically floating light-shielding layer is Sd, an opposing area in plan view of the gate electrode and the electrically floating light-shielding layer is Sg, and a G/D ratio is a ratio Sg/Sd, and wherein a first of the two transistors has a larger G/D ratio than that of the second of the two transistors, and said first of the two transistors is directly connected to a pixel electrode.

* * * * *